US012095481B2

(12) United States Patent
Steiner et al.

(10) Patent No.: US 12,095,481 B2
(45) Date of Patent: Sep. 17, 2024

(54) EFFICIENT DECODING SCHEMES FOR ERROR CORRECTING CODES FOR MEMORY DEVICES

(71) Applicant: Kioxia Corporation, Tokyo (JP)

(72) Inventors: Avi Steiner, Tel Aviv (IL); Zion Nahisi, Tel Aviv (IL); Ofir Kanter, Tel Aviv (IL); Amir Nassie, Tel Aviv (IL); Hanan Weingarten, Tel Aviv (IL)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/586,290

(22) Filed: Jan. 27, 2022

(65) Prior Publication Data
US 2023/0253985 A1    Aug. 10, 2023

(51) Int. Cl.
*H03M 13/29*     (2006.01)
*H03M 13/11*     (2006.01)
*H03M 13/15*     (2006.01)
*H03M 13/45*     (2006.01)

(52) U.S. Cl.
CPC ... *H03M 13/2909* (2013.01); *H03M 13/1108* (2013.01); *H03M 13/1125* (2013.01); *H03M 13/1128* (2013.01); *H03M 13/152* (2013.01); *H03M 13/458* (2013.01)

(58) Field of Classification Search
CPC ......... H03M 13/1128; H03M 13/1108; H03M 13/1125; H03M 13/152; H03M 13/2909; H03M 13/458
See application file for complete search history.

(56) References Cited

U.S. PATENT DOCUMENTS

| 10,388,400 | B2* | 8/2019 | Kumar | G06F 11/1088 |
| 2006/0020869 | A1* | 1/2006 | Desai | H03M 13/2909 714/752 |
| 2007/0033495 | A1* | 2/2007 | Bachu | H03M 13/458 714/776 |
| 2011/0214039 | A1* | 9/2011 | Steiner | G06F 11/1012 714/E11.032 |
| 2020/0293399 | A1* | 9/2020 | Steiner | G11C 29/844 |

* cited by examiner

*Primary Examiner* — Steve N Nguyen
(74) *Attorney, Agent, or Firm* — Foley & Lardner LLP

(57) ABSTRACT

A system for decoding data stored in a non-volatile storage device may include processing circuits configured to decode, in a first iteration, each of a plurality of component codes corresponding to the data by performing a first number of enumerations over hypotheses. The processing circuits may be configured to determine, in the first iteration, an extrinsic value output for each of the component codes based on log-likelihood ratios (LLRs) of one or more error bits of a codeword. The processing circuits may be configured to determine a second number of enumerations based on the extrinsic value. The processing circuits may be configured to decode, in a second iteration, each of the plurality of component codes by performing the second number of enumerations over hypotheses.

10 Claims, 13 Drawing Sheets

EFFICIENT DECODING SCHEMES FOR ERROR CORRECTING CODES FOR MEMORY DEVICES

TECHNICAL FIELD

The present arrangements relate generally to system and method for performing error correction operations on a memory device, and more particularly to system and method for performing an iterative soft decoding.

BACKGROUND

As the number and types of computing devices continue to expand, so does the demand for memory used by such devices. Memory includes volatile memory (e.g. RAM) and non-volatile memory. One popular type of non-volatile memory is flash memory or NAND-type flash. A NAND flash memory array includes rows and columns (strings) of cells. A cell may include a transistor. In NAND flash devices, soft decoding is performed based on soft information. Improvements in soft decoding capabilities in NAND flash devices remain desired.

SUMMARY

The present arrangements relate to system and method for performing an iterative soft decoding based on a result of a previous iteration to reduce decoding complexity.

According to certain aspects, arrangements provide a method for decoding data stored in a non-volatile storage device. The method may include decoding, in a first iteration, each of one or more component codes corresponding to the data to return a plurality of solutions. The method may include generating, in the first iteration, a candidate list based on the plurality of solutions corresponding to each component code. The method may include decoding, in a second iteration, each component code based on the candidate list. The candidate list includes one or more ranked solutions having lowest log-likelihood ratios (LLRs) among the plurality of solutions.

According to other aspects, arrangements provide a method for decoding data stored in a non-volatile storage device. The method may include decoding, in a first iteration, each of a plurality of component codes corresponding to the data by performing a first number of enumerations over hypotheses. The method may include determining, in the first iteration, an extrinsic value output for each of the component codes based on log-likelihood ratios (LLRs) of one or more error bits of a codeword. The method may include determining a second number of enumerations based on the extrinsic value. The method may include decoding, in a second iteration, each of the plurality of component codes by performing the second number of enumerations over hypotheses.

According to other aspects, arrangements provide a system for decoding data stored in a non-volatile storage device. The system may include processing circuits configured to decode, in a first iteration, each of a plurality of component codes corresponding to the data by performing a first number of enumerations over hypotheses. The processing circuits may be configured to determine, in the first iteration, an extrinsic value output for each of the component codes based on log-likelihood ratios (LLRs) of one or more error bits of a codeword. The processing circuits may be configured to determine a second number of enumerations based on the extrinsic value. The processing circuits may be configured to decode, in a second iteration, each of the plurality of component codes by performing the second number of enumerations over hypotheses.

BRIEF DESCRIPTION OF THE DRAWINGS

These and other aspects and features of the present arrangements will become apparent to those ordinarily skilled in the art upon review of the following description of specific arrangements in conjunction with the accompanying figures, wherein.

DETAILED DESCRIPTION

According to certain aspects, arrangements in the present disclosure relate to techniques for performing an iterative soft decoding based on a result of a previous iteration to reduce decoding complexity.

Before describing problems to be solved by arrangements of the present disclosure, an example encoding process and example code structures will be described with reference to FIG. 1 to FIG. 3B.

Figure 1:
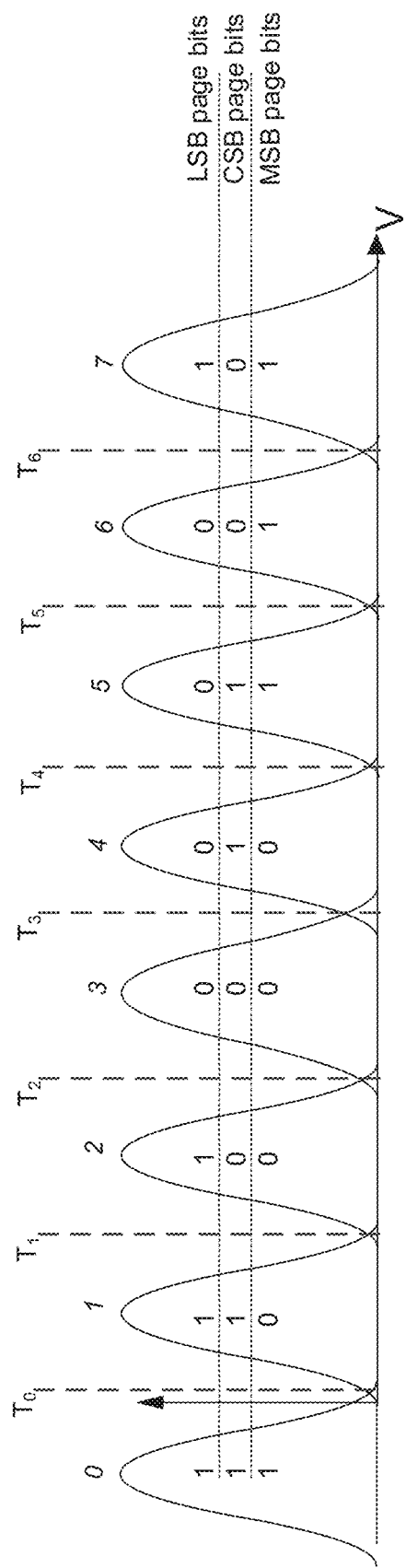
FIG. 1 illustrates threshold voltage distribution in a conventional three bits per cell (bpc) flash device.

FIG. 1 illustrates threshold voltage distribution in a conventional three bits per cell (bpc) flash device. FIG. 1 shows a voltage threshold distribution of a 3 bits per cell (bpc) flash memory device. The voltage threshold (VT) distribution includes eight lobes. An MSB (most significant bit) page read requires using thresholds T0, T4. For reading CSB (center significant bit) pages the read thresholds T1, T3 and T5 are used. For reading LSB (least significant bit) pages the read thresholds T2 and T6 have to be used. The lower most distribution is known as the erase level.

Due to different NAND noise and interference sources during programming and during read, there may be errors in the programmed and read output. This can be due to programming errors, or during read with non-optimal thresholds or following retention/read-disturb stresses, etc. The result of all these noise sources is errors on the information bits that are originally saved to NAND. A strong error correction code (ECC) can allow faster programming, with possibly higher programming errors, and read under high stress conditions, and/or with lower complexity digital signal processing (DSP).

A code rate is defined by the ratio of its information content, called payload, to the overall size of a codeword. For example, for a code that contains k bits and r redundancy bits that rate is defined by $R_c=k/(k+r)$. The common encoding methods are not very well suited to support high rate codes when both hard and soft decoding are considered. For example, for conventional low-density parity-check codes (LDPC) for very high rates (say 0.9), the code length tends to be considerable resulting in a very complex and costly implementation.

In some implementations, a special structure of multi-dimensional encoding with simple code components can obtain high decoding efficiency with a reasonable complexity for both hard input or soft input to the decoder. These properties make a code especially suitable for storage applications such as NAND Flash devices or controllers for NAND flash. Some key features of this coding scheme are instrumental in designing a coding system for storage. One of the features is high raw bit error rate (RBER) error correction capability with hard input to the decoder, which is important in a storage system since it requires a single read operation. This means that high performance on read from the storage device may be achieved throughout the device lifespan. Another key feature is configurability. For example, the code rate may be configured per application, and with a single engine it is possible to configure with firmware the code parameters which determine the payload size and redundancy size. This feature allows using different codes for different type of pages, according to their RBER characteristics. Alternatively, payload size can be determined such that the tradeoff of performance vs reliability is optimized. Another key feature is high raw bit error rate (RBER) error correction capability with soft input to the decoder. This feature is important in storage systems since it can provide high reliability at high Program/Erase (P/E) cycle counts and difficult retention conditions. This feature is crucial for storage systems which typically require a very small undecodable bit error rate (UBER) of 1E-15.

In multi-dimensional encoding, a stream of data is passed through a set of multiple component encoders, which together encode the full payload into a single codeword. For example, Bose-Chaudhuri-Hocquenghem (BCH) encoding may be done by using a shift register through which the systematic data is passed. Therefore, that data simply passes through the component encoders without being modified while the shift-register advances. When the systematic data of the code completely passed through the shift-register, the content of the shift register is the redundancy of the code and is appended to the data stream. This principle works for all component encoders in all dimensions.

Multi-dimensional encoding also can be obtained with product codes or symmetric product codes, which is a special case of product codes, and may provide improved capabilities. These structures create a product of code components to obtain a full codeword, and the decoding process typically involves iterative decoding of the component codes.

In some arrangements, the ECC structure includes a modified half product code, referred to as a half folded-product code (HFPC). A HFPC structure is composed of multiple small code components, where each code component can be for example a BCH code. The number of code components n is determined by the correction capability of each component and the required code rate. For example, given a minimum distance $D_{min}$ per component, the correction capability t of each component is:

$$t=(D_{min}-1)/2 \qquad \text{(Equation 1)}$$

The amount of bits r used for redundancy is $$r=Q\cdot(D_{min}-1)/2, \qquad \text{(Equation 2)}$$

where Q is the Galois field parameter for the BCH component defined over GF $(2^Q)$. Given a code rate R and payload length K bits, the number of components is determined by $$n = \left\lceil K \cdot \frac{1-R}{r \cdot R} \right\rceil; \text{or} \qquad \text{(Equation 3)}$$

$$n = \left\lceil 2K \cdot \frac{1-R}{Q \cdot (D_{min}-1) \cdot R} \right\rceil \qquad \text{(Equation 4)}$$

The encoding process may include organizing the information bits in a pseudo triangular matrix form, and performing folded BCH encoding for every component.

Figure 2:
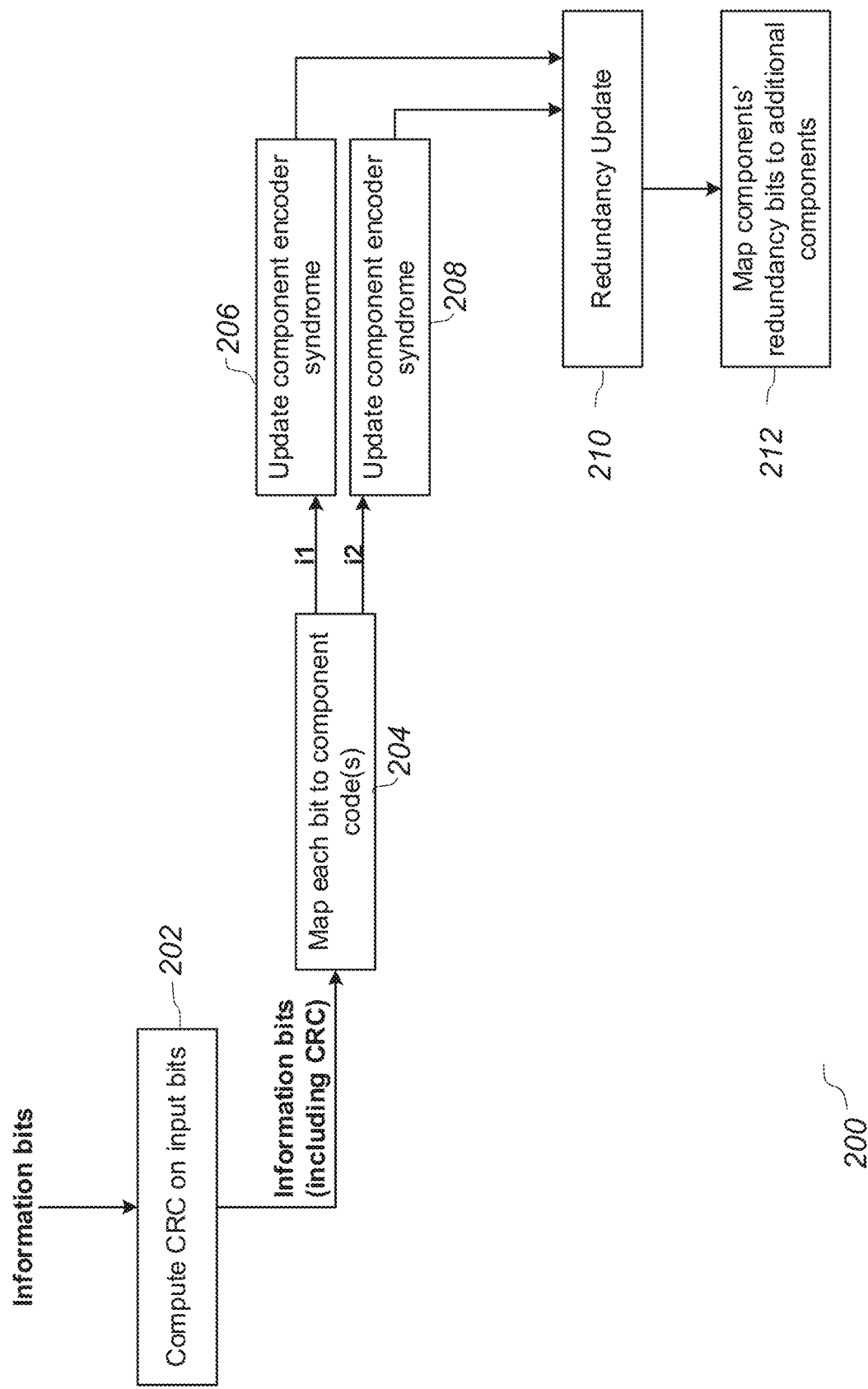
FIG. 2 is a flowchart illustrating an example methodology for obtaining half product code (HPC) or half folded-product code (HFPC) with cyclic redundancy check (CRC) added to input bits, according to some arrangements.

FIG. 2 is a flowchart illustrating an example methodology for obtaining half product code (HPC) or half folded-product code (HFPC) with cyclic redundancy check (CRC) added to input bits, according to some arrangements.

In HFPC codes, every information bit is encoded by (at least) two code components, and each component is intersected with all other code components. That is, for code components which encode the information bits the encoding process is done such that the systematic bits of every code component is also encoded by all other code components (which together provide the encoding of every information bit by two code components). This is one of the key building blocks of the encoder. FIG. 2 shows an example HFPC encoding flow 200. The flow 200 may start with receiving information bits as input bits and computing CRC on the input bits (S202). The flow may map each bit of the information bits including CRC, to two component codes (S204). The flow may update syndrome for encoding of each component code (S206, S208). The flow may update redundancy (S210) and map redundancy bits of the component codes to additional component codes (S212). In this manner, A HFPC code can be obtained by letting every pair of code component encode more than one information bit. For constructing strong high rate HFPC codes, there may be several common bits for every pair of code components.

The redundancy bits generated from the half folded-product code encoding process described above may be left uncoded and thus the redundancy bits may have a degree-one level of protection. Alternatively, redundancy bits may be encoded by a separate set of code components which encode all or a subset of these redundancy bits by another set of code components. This may result in a folded product code encoding over the redundancy bits, which together with the information bits encoding results in a low complexity encoding process.

Figure 3A:
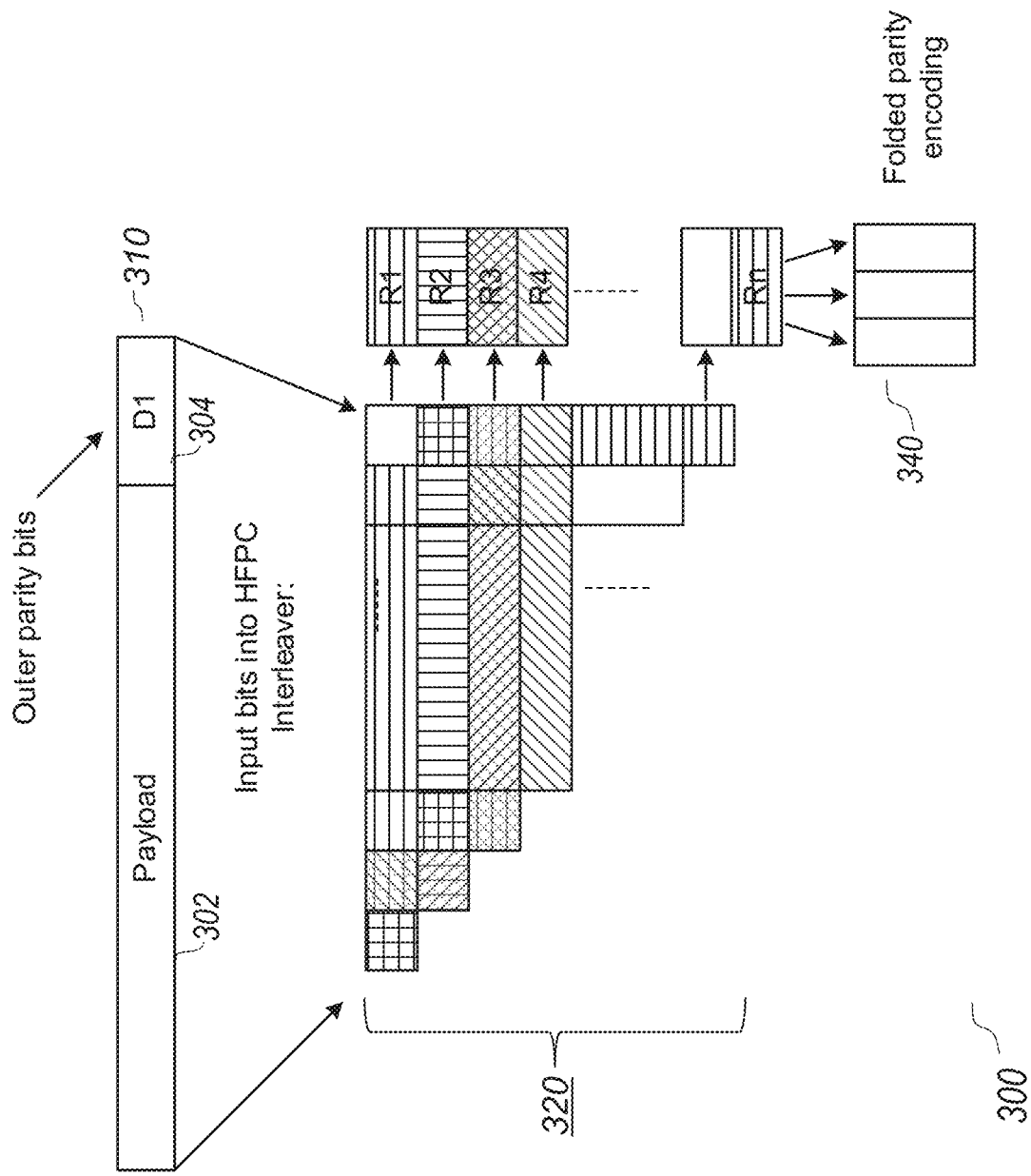
FIG. 3A is a block diagram illustrating an example HFPC structure according to some arrangements.

FIG. 3A is a block diagram illustrating an example HFPC structure 300 according to some arrangements. Referring to FIG. 3A, the HFPC structure 300 may be an HFPC interleaver configured to organize (e.g., interleave or map) input bits 310 into a form of a pseudo triangular matrix 320. The input bits 310 may include input payload 302 and signature bit(s) D1 304, in some examples. The input payload 302 may include the information bits. An example of D1 303 is extra CRC bits. Each of R1-Rn represents redundancy bits corresponding to corresponding component codes. For example, R1 redundancy bits are obtained by encoding (e.g., folded component encoding) the input bits 310 in a first row of the matrix 320. R2 redundancy bits are obtained by encoding (e.g., via folded component encoding) the input bits 310 in a first column and the second row. Folded parity encoding can be used to encode at least a portion of each of R1-Rn into another component code (e.g., a folded product code 340, which is a set of component codes). The folded product code 340 is comprised of the parity bits.

Figure 3B:
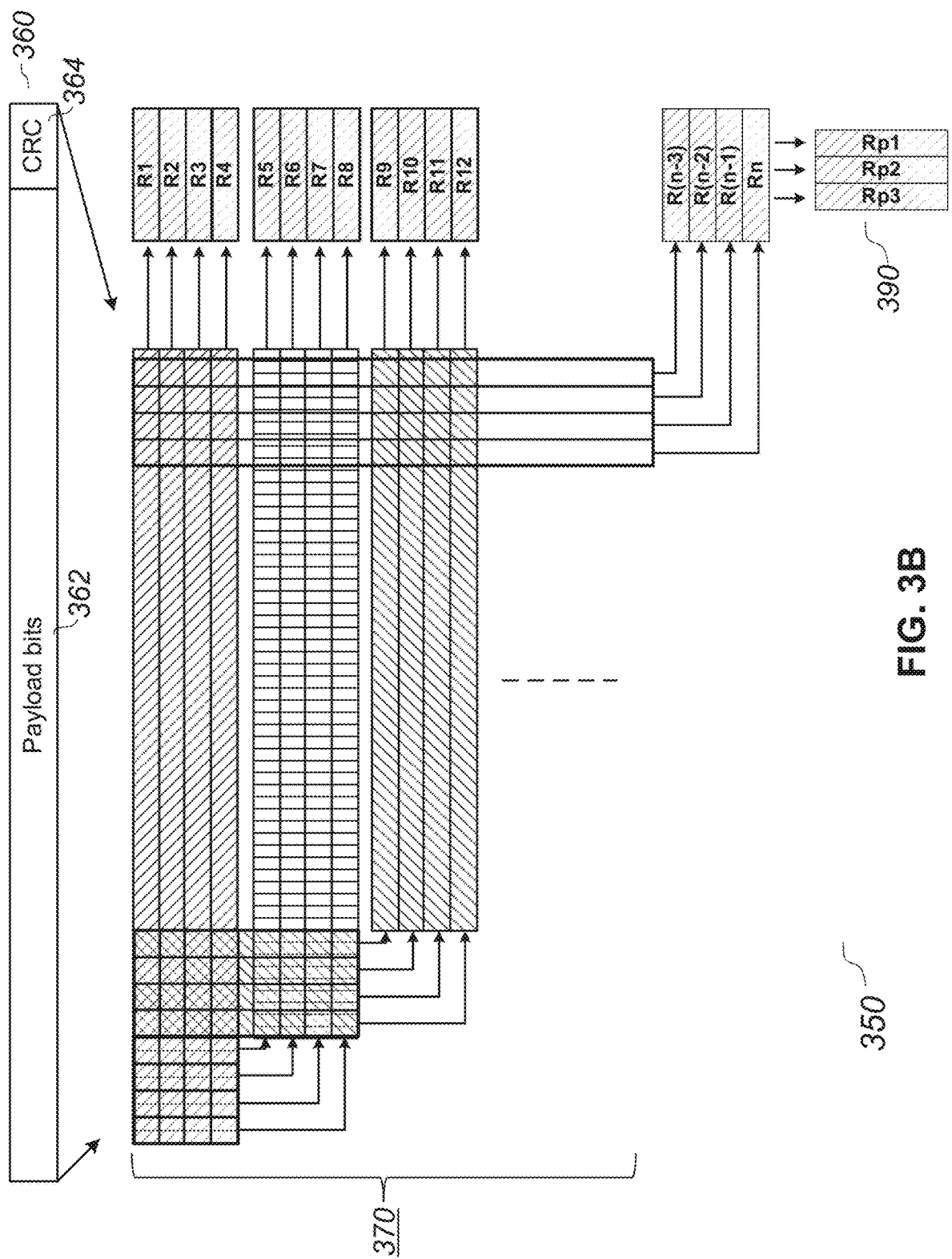
FIG. 3B is a block diagram illustrating another example HFPC structure according to some arrangements.

FIG. 3B is a block diagram illustrating another example HFPC structure 350 according to some arrangements. Referring to FIG. 3B, similar to the HFPC structure 300 in FIG. 3A, the HFPC structure 350 may be an HFPC interleaver configured to organize (e.g., interleave or map) input bits 360 into a form of a pseudo triangular matrix 370. The input bits 360 may include input payload 362 and CRC 364. Compared to the HFPC structure 300 in FIG. 3A, the HFPC interleaver 350 may allow the component codes within a same group (of 4 component codes) to encode separate sets of the input bits 360 and to be independent of each other. As a result, redundancy bits are grouped such that each group of redundancy bits are determined based on a same group of component codes. For example, R1-R4 are redundancy bits determined based on a same group of component codes. A component code (parity bits) 390 may be generated by using folded parity encoding to encode at least a portion of each of R1-Rn into the component code 390.

As shown in FIG. 2, FIG. 3A and FIG. 3B, in half folded-product code (HFPC) there may be several common bits for every pair of code components. The redundancy generated bits from the HFPC encoding process described above are encoded by a separate set of code components which encode all or a subset of these redundancy bits by another set of code components. Doing this may form a folded product code encoding over the redundancy bits, which together with the information bits encoding results in a low complexity encoding process. In general, the number of component codes used for encoding the redundancy can change depending on code rate and intersection size required for redundancy bits. As a special case the number of component codes may be decided not to encode the redundancy bits at all, which may form some irregularity to the degree of protection to bits within the codeword, and may have advantages in terms of waterfall capability. A lower complexity encoding and decoding code structure can be obtained by defining groups of independent code components. For every group, the code components within the group encode separate sets of information bits (see FIG. 3B). A special case is when the code components are divided into two groups. For two groups of independent code components the resulting coding scheme is folded product code.

Now, soft decoding of HFPC will be described. Soft input can be obtained by performing multiple reads from the flash memory, where each read operation uses different read thresholds. The read thresholds may be configured such that soft metrics, called log-likelihood ratio (LLR), can be computed per bit. The definition of an LLR is $$LLR(b_i) = \log\left(\frac{P(b_i = 1|y)}{P(b_i = 0|y)}\right)$$ (Equation 5)

where y is the channel output and $b_i$ is the $i^{th}$ bit of some page. The LLR expression can be substantially simplified, for an additive white Gaussian noise (AWGN) channel model. The AWGN is also a good approximation in many cases for the flash lobes' distribution. By assuming an AWGN channel, $$P(b_i|y) = \frac{1}{\sqrt{2\pi\sigma^2}}\exp\left(-\frac{(y-b_i)^2}{2\sigma^2}\right)$$ (Equation 6)

where y is the AWGN channel output. It is straightforward to show that the LLR(bi) becomes $$LLR(b_i) = \frac{2y}{\sigma^2}$$ (Equation 7)

where the LLR per bit is created during the multiple flash reads, as a quantized version of an AWGN channel. The quantization level per threshold is directly determined by the number of reads, as the base-two logarithm of the read counter. Once, the multiple reads have been conducted, and LLRs are available for all codewords bits, the decoding process begins. There are many possible approximations for LLR values' mapping for implementation efficiency, such as mapping to fixed point integer values.

For product codes there are several known decoding algorithms when soft information is available to decoder. The general approach includes decoding each component code separately to generate output reliabilities per bit, which are applied and used for iterative decoding of the component code. For example, soft decoding of a BCH component code, soft information per bit may be used. Iterative soft decoding may include the process of performing soft decoding on some of the code components, and applying the most likely corrections (under different conditions, as will be elaborated here). A common approach for soft decoding includes enumeration over low reliability bits, while trying to solve the BCH code per hypothesis. Other approaches include enumeration on least reliable bits together with assumptions that all errors are within a set of Qxt bits, and performing erasure decoding. This approach is known as ordered statistics decoding. If the BCH components with decoding capability of t≤4, then soft decoding may be efficiently implemented here (in terms of computational complexity, or hardware implementation), as per hypothesis a solution may directly be computed using a syndrome lookup table (LUT).

Now, problems to be solved by arrangements of the present disclosure will be described.

As described above, improvements of higher endurance and better resilience to retention and read-disturb stresses in decoding capabilities in NAND flash devices remain desired. Moreover, there is need for obtaining a higher decode reliability with a low read and decode complexity, which is due to the inherent gain provided from the decoding capability for a given code.

Moreover, in soft decoding hardware implementation, the part which consumes most of the decoding time is the enumeration over multiple hypotheses to generate valid solutions and scores. The decoding latency for high capability is in most cases proportional to the total number of enumerations in decoding. Therefore, complexity reduction without any capability degradation is highly desired.

To address these problems, according to certain aspects, arrangements in the present disclosure relate to techniques for obtaining higher endurance and higher reliability for advanced technology NAND, such as QLC NAND flash devices by novel soft decoding approach for some code structures. A decoding scheme according to some arrangements is highly adequate for product codes, half product codes, and for half folded-product code (HFPC), which enables decoding high BER using high code rates as required for NAND flash memories.

Some arrangements can provide several methods, which in combination allow decoder complexity reduction by almost half without any capability degradation. This ECC encoder/decoder can be implemented on a NAND memory controller hardware and/or firmware, and/or host software, and lends itself to low complexity processing.

In some arrangements, a soft decoding scheme may obtain high error correction capabilities for soft decoding, enabling correction of higher BER with soft decoding. This scheme can be implemented with relatively low complexity, allowing for efficient hardware implementation.

In some arrangements, a soft decoding scheme may achieve higher performance via reduction in decoding complexity by performing iterative decoding of component codes. Each component code processing may include (1) saving or storing a few of the highest likelihood decoding results per component; (2) creating or saving a historical candidate list for utilization on next iteration; (3) dynamic decision flow, according to component reliability on the previous iteration, for performing relatively short enumerations, which may mainly rely on the previous iteration historical list that was saved; (4) dynamic adaptation or direct mapping of a list size according to component reliability on the previous iteration; and/or (5) small perturbations for an enumeration size to improve probability of convergence.

In some arrangements, when performing any type of soft decoding for a component code, it may include creating a list of candidates of the most likely error hypotheses for valid codeword corrections. A soft score for every result of valid codeword can be computed by $$S_{LLR} = \sum_{b_m \in C} |LLR(b_m)| \quad \text{(Equation 8)}$$

where C is the set of error bits, and $b_m$ is a location of an error bit. In some arrangement, the selected error hypothesis of a soft component decoder has the smallest $S_{LLR}$ score.

In some arrangements, a decoder may perform a joint components soft decoding (see FIG. 6), where the results of each component extrinsic values are fed to all other dependent components. In HFPC, all other components may be dependent and also benefit from the updated extrinsic values. Compared to sequential iterative soft decoding, in the joint components iterative soft decoding, (1) the extrinsic output may be computed from each component before each iteration, and (2) during the progress of an iteration, the extrinsic values are static, and cannot be updated. In some arrangements, joint components soft decoding can be implemented using parallel processing such that component soft decoding is simultaneously performed for multiple components during a given iteration.

In some arrangements, a system for decoding data stored in a non-volatile storage device may include processing circuits configured to decode, in a first iteration, each of one or more component codes corresponding to the data to return a plurality of solutions. The processing circuits may be configured to generate, in the first iteration, a candidate list based on the plurality of solutions corresponding to each component code. The processing circuits may be configured to decode, in a second iteration, each component code based on the candidate list. The candidate list includes one or more ranked solutions having lowest log-likelihood ratios (LLRs) among the plurality of solutions.

In some arrangements, each of the one or more solutions may include bit locations. In generating the candidate list, the processing circuits may be configured to determine whether a bit at a first bit location of a component code is flipped at the first iteration. In response to determining that the first bit location is flipped at the first iteration, the processing circuits may be configured to remove the first bit location from a solution of the candidate list.

In some arrangements, in decoding, in the second iteration, each of the plurality of component codes based on the candidate list, the processing circuits may be configured to solve hypotheses based on the one or more solutions of the candidate list. After solving hypotheses based on the one or more solutions of the candidate list, the processing circuits may be configured to generate a plurality of hypotheses without using the candidate list, and solve the generated plurality of hypotheses.

In some arrangements, in generating the candidate list in the first iteration, the processing circuits may be configured to obtain a previous candidate list passed from an iteration that is prior to the first iteration, and update the previous candidate list based on the plurality of solutions. In updating the previous candidate list, the processing circuits may be configured to calculate extrinsic values for component codes based on the plurality of solutions, calculate LLR values for the component codes based on the extrinsic values, and update the previous candidate list based on the LLR values for the component codes.

In some arrangements, in generating the candidate list in the first iteration, the processing circuits may be configured to determine whether there is a previous candidate list passed from a prior iteration that is prior to the first iteration. In response to determining that there is a previous candidate list passed from the prior iteration, the processing circuits may be configured to update the previous candidate list based on the plurality of solutions. In response to determining that there is no previous candidate list, the processing circuits may be configured to generate the one or more ranked solutions having lowest LLRs among the plurality of solutions and save the one or more ranked solutions as the candidate list for the second iteration. In updating the previous candidate list, the processing circuits may be configured to calculate extrinsic values for component codes based on the plurality of solutions, calculate LLR values for the component codes based on the extrinsic values, and update the previous candidate list based on the LLR values for the component codes.

In some implementations, in decoding each component code in the first iteration, the processing circuits may be configured to (1) obtain soft input by performing multiple reads from the non-volatile storage device and (2) perform decoding on the soft input. In some implementations, each component code is a Bose-Chaudhuri-Hocquenghem (BCH) code.

In some arrangements, a system for decoding data stored in a non-volatile storage device may include processing circuits configured to decode, in a first iteration, each of a plurality of component codes corresponding to the data by performing a first number of enumerations over hypotheses. The processing circuits may be configured to determine, in the first iteration, an extrinsic value output for each of the component codes based on log-likelihood ratios (LLRs) of one or more error bits of a codeword. The processing circuits may be configured to determine a second number of enumerations based on the extrinsic value. The processing circuits may be configured to decode, in a second iteration, each of the plurality of component codes by performing the second number of enumerations over hypotheses.

In some arrangements, in determining the second number of enumerations, the processing circuits may be further configured to determine whether the extrinsic value is greater than or equal to a threshold value. In response to determining that the extrinsic value is greater than or equal to the threshold value, the processing circuits may be configured to determine the second number of enumerations that is smaller than the first number. In response to determining that the extrinsic value is smaller than the threshold value, the processing circuits may be configured to determine the second number of enumerations that is greater than or equal to the first number.

In some arrangements, the processing circuits may be further configured to obtain an enumeration list of enumeration numbers such that enumeration numbers are saved in the list in an increasing order. The first number of enumerations may correspond to an enumeration number at a first location of the enumeration list. In determining the second number of enumerations, the processing circuits may be further configured to determine whether the extrinsic value is smaller than an increasing threshold value. In response to determining that the extrinsic value is smaller than the increasing threshold value, the processing circuits may be configured to determine the second number to be an enumeration number at a location of the enumeration list next to the first location. The processing circuits may be further configured to determine whether the extrinsic value is greater than or equal to a decreasing threshold value that is greater than the increasing threshold value. In response to determining that the extrinsic value is greater than or equal to the decreasing threshold value, the processing circuits may be configured to determine the second number to be an enumeration number at a location of the enumeration list prior to the first location.

In some arrangements, the processing circuits may be further configured to obtain a threshold list of threshold values such that threshold values are saved in the threshold list in an increasing order, and obtain an enumeration list of enumeration numbers such that enumeration numbers are saved in the enumeration list in an increasing order corresponding to the threshold values in the threshold list. In determining the second number of enumerations, the processing circuits may be further configured to determine whether the extrinsic value is greater than or equal to a first threshold value at a first location of the threshold list and smaller than a second threshold value at a second location of the threshold list next to the first location. In response to determining that the extrinsic value is greater than or equal to the first threshold value and smaller than the second threshold value, the processing circuits may be configured to determine the second number to be an enumeration number at a location of the enumeration list corresponding the first location of the threshold list.

In some arrangements, the processing circuits may be further configured to obtain a number of sign changes in results of hard decision on a particular component code. In determining the second number of enumerations, the processing circuits may be further configured to determine whether the number of sign changes is greater than or equal to a third threshold value. In response to determining that the number of sign changes is greater than or equal to the third threshold value, the processing circuits may be configured to determine the second number of enumerations that is greater than or equal to the first number. In response to determining that the number of sign changes is smaller than the third threshold value, the processing circuits may be configured to determine the second number of enumerations that is smaller than the first number.

In some arrangements, the processing circuits may be further configured to obtain a perturbation list of factor values such that factor values are saved in the perturbation list in an order corresponding to an order of iterations. In determining the second number of enumerations, the processing circuits may be further configured to determine a third number of enumerations based on results of the first iteration of decoding. The processing circuits may be configured to determine the second number of enumerations by multiplying the third number by a factor value of the perturbation list corresponding to the second iteration. In some implementations, each of the plurality of component codes may be a Bose-Chaudhuri-Hocquenghem (BCH) code.

Arrangements in the present disclosure have at least the following advantages and benefits.

First, arrangements in the present disclosure can provide useful techniques for determining the hypotheses for enumeration in soft decoding, thereby achieving a significant reduction in decoding latency obtained from decoding complexity reduction.

Second, arrangements in the present disclosure can provide useful techniques for obtaining a higher decode reliability with a low read and decode complexity, which is due to the inherent gain provided from the decoding capability for a given code.

Third, arrangements in the present disclosure can provide useful techniques for performing joint components soft decoding, including improvements in higher reliability compared to sequential soft decoding and straightforward parallel implementation on hardware, as it performs the update of extrinsic values only after an iteration is done. During the iterations, the LLR inputs may be predetermined (from previous iteration).

Figure 4:
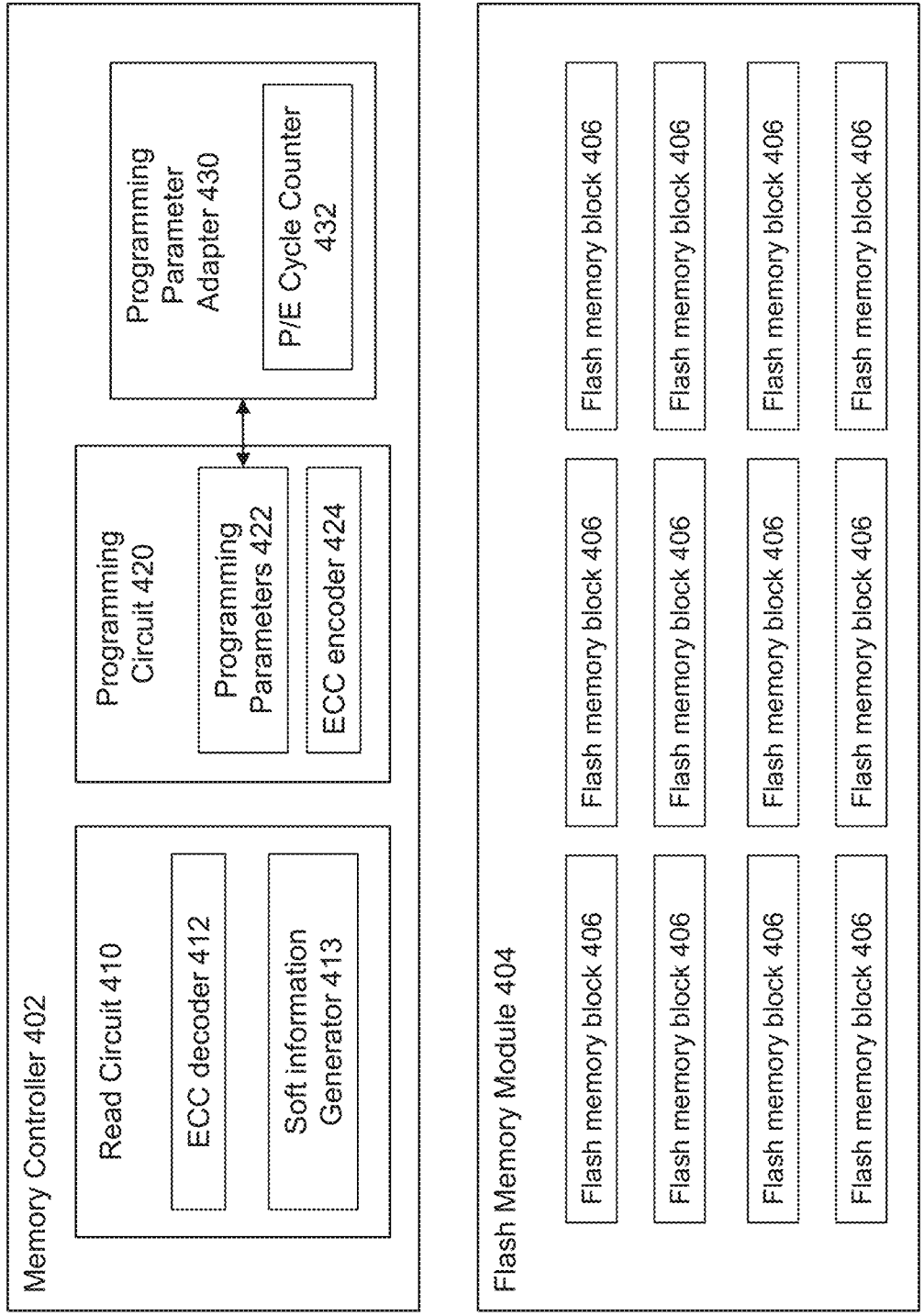
FIG. 4 illustrates is a block diagram illustrating an example flash memory system according to some arrangements.

FIG. 4 is a block diagram illustrating an example flash memory system 400 according to some arrangements, which can perform any of the methods described in the present disclosure.

The flash memory system 400 (e.g., NAND device, NAND flash device) may include a flash memory module or flash memory device 404 and a memory controller 402. The flash memory module 404 may include multiple flash memory blocks 406, each of which includes multiple flash memory rows/pages (not shown). In some arrangements, each of the multiple flash memory rows/pages may have a plurality of cells. Additionally or alternatively, the module 404 can comprise or be implemented using a plurality of dies, each of the dies containing a plurality of the blocks 406.

The memory controller 402 may include a read circuit 410, a programming circuit (e.g. a program DSP) 420 and a programming parameter adapter 430. As shown in FIG. 4, the adapter 430 can adapt the programming parameters 422 used by programming circuit 420 as described above. The adapter 430 in this example may include a Program/Erase (P/E) cycle counter 432. Although shown separately for ease of illustration, some or all of the adapter 430 can be incorporated in the programming circuit 420. In some arrangements, the read circuit 410 may include an ECC decoder 412 and a soft information generator 413. In some arrangements, the programming circuit 420 may include an ECC encoder 424. Arrangements of memory controller 402 can include additional or fewer components such as those shown in FIG. 4.

In some arrangements, a flash memory system (e.g., the flash memory system 400 in FIG. 4) may include a cell flash memory (e.g., the flash memory module 404 or a flash memory block 406 in FIG. 4) and a circuit (e.g., the read circuit 410 or the programming circuit 420 in FIG. 4) for performing operations of the plurality of cells. In some arrangements, the flash memory module 404 may have a plurality of cells. In some arrangements, each of the flash memory blocks 406 may have a plurality of cells. In some arrangements, the soft information generator 413 of the read circuit 410 may be configured to generate soft information based on estimated optimal positions of reference voltages (or threshold voltages). The read circuit 410 may be configured to perform a read operation on the first cell and decode, via the ECC decoder 412, a result of the read operation on the first cell based on the soft information. Methods of efficiently decoding with error correcting codes by the ECC decoder 412 according to some arrangements will be described below with reference to FIG. 5 to FIG. 12.

In some arrangements, the cell flash memory (e.g., the flash memory module 404 or a flash memory block 406 in FIG. 4) may include rows and columns of the plurality of cells. In some arrangements, a flash memory block 406 may include a plurality of pages (not shown) and a page may be defined as cells linked with the same word line, which correspond to a row of cells. In some arrangements, neighboring cells of a target cell are cells adjacent to the target cell. For example, each of a first neighboring cell and a second neighboring cell (of a first cell) may be positioned at the same column as a column of the first cell and at a row adjacent to a row of the first cell.

Figure 7:
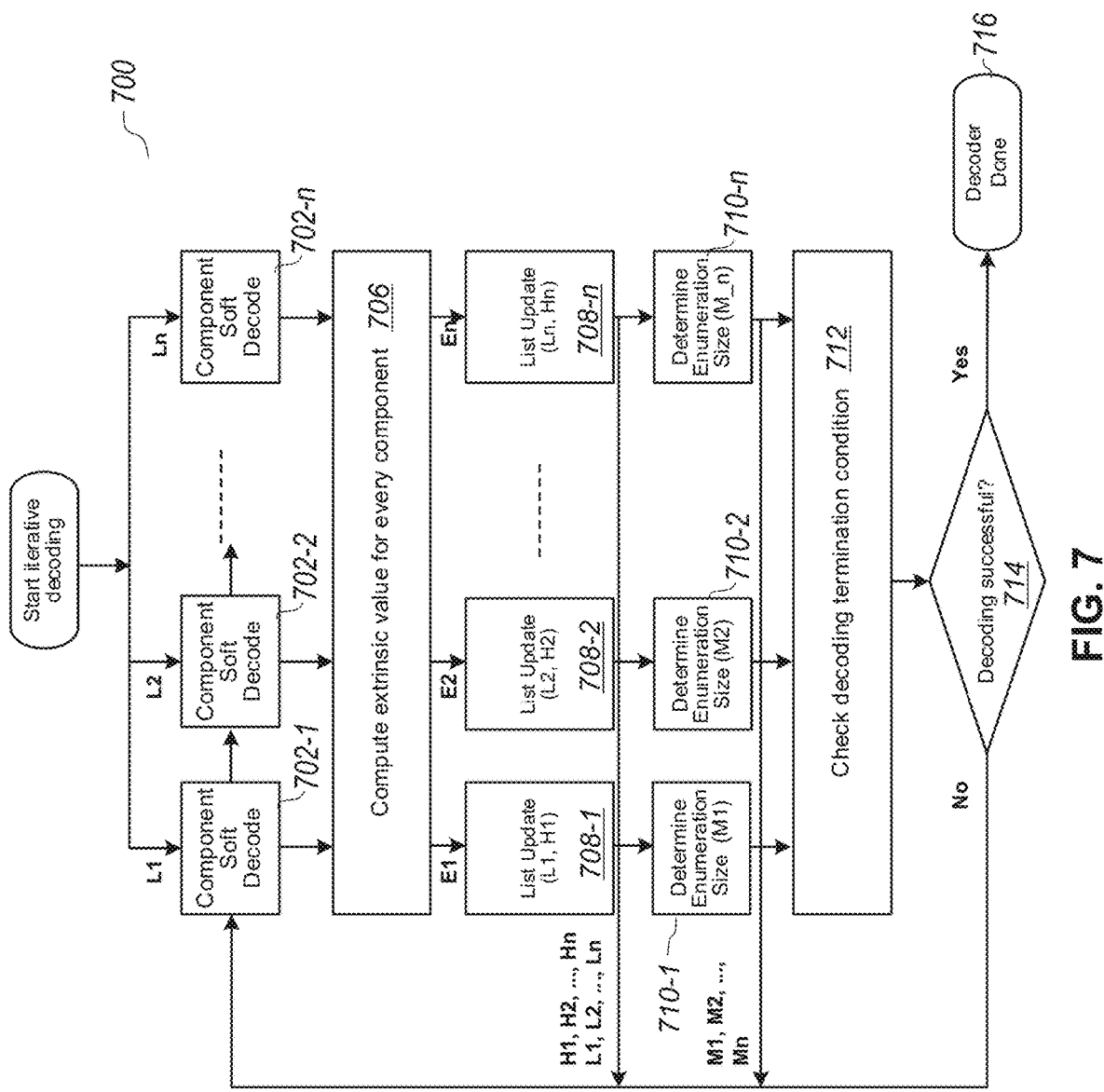
FIG. 7 is a flowchart illustrating an example methodology for iterative soft decoding with generation of historical candidates list according to some arrangements.

FIG. 7 is a flowchart illustrating an example methodology for sequential soft decoding of HFPC according to some arrangements.

Figure 5:
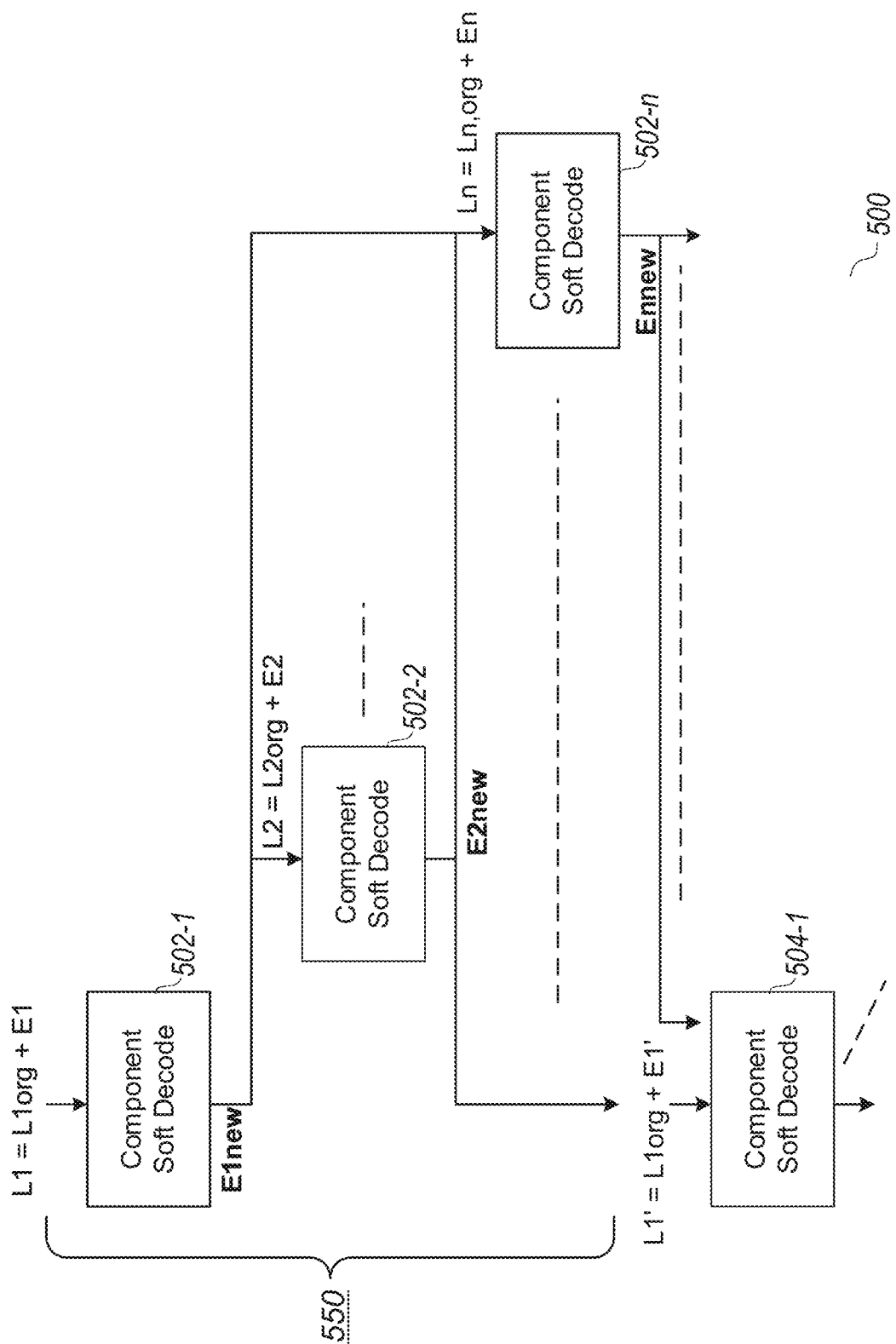
FIG. 5 is a flowchart illustrating an example methodology for sequential soft decoding of HFPC according to some arrangements.

FIG. 5 shows an example sequential iterative soft decoding flow 500. The flow 500 may perform soft decoding iterations. For example, in a first iteration (S550), the flow may perform soft decoding on each component code of n component codes (S502-1, S502-2, . . . , S502-n) until a termination condition is reached. If the termination condition is not met, the flow may perform a second iteration by starting with soft decoding with a first component code (S504-1).

In soft decoding a component code, a decoder (e.g., the ECC decoder 412 in FIG. 4) may take an LLR value as an input and calculate an extrinsic value as an output. Each (computed) LLR value can be expressed as the sum of (1) an intrinsic value and (2) an extrinsic value. The intrinsic value is available at the channel output before any decoding stage, and the extrinsic value is provided by exploiting the dependencies existing between the component being processed and the other component codes processed by the decoder.

For example, in soft decoding a component code 1 (S502-1), the decoder may input LLR value L1 which is expressed as the sum of (1) intrinsic value L1org and (2) extrinsic value E1, and output a new extrinsic value E1new. This new extrinsic value outputted at S502-1 may affect decoding results of other component codes in their soft decoding steps (e.g., S502-2 to S502-n).

Now, a sequential iterative soft decoding of HFPC code will be described in more detail. In some arrangements, sequential iterative soft decoding may be performed to obtain high performance of soft decoding. In some arrangements, a decoder may perform the following three steps (Step 1, Step 2, and Step 3) for an iterative sequential decoding for HFPC. In Step 1, the decoder may create a list of unsolved component codes, e.g. by choosing components with a non-zero syndrome in BCH codes.

In Step 2, for each component for decoding, the decoder may perform the following sub-steps (a)-(d). In sub-step (a), the decoder may perform enumeration of hypothesis and solve every hypothesis e.g., using a BCH solver. In sub-step (b), for every valid candidate codeword C, the decoder may compute a score $S_{LLR}(C)$ according to Equation 8 described above. In sub-step (c), the decoder may save a best score $S_1$ and a second best score $S_2$, defined as follows:

$$S_1 = \min_{C \in L} S_{LLR}(C) \quad \text{(Equation 9)}$$

$$C_{ML} = \arg\min_{C \in L} S_{LLR}(C) \quad \text{(Equation 10)}$$

$$S_2 = \min_{C \in L, C \neq C_{ML}} S_{LLR}(C) \quad \text{(Equation 11)}$$

where L is a valid codeword list, and $C_{ML}$ is a most likely codeword.

In sub-step (d), the decoder may compute an extrinsic value output for the component of the most likely codeword $C_{ML}$ based on the scores $S_1$ and $S_2$. The extrinsic value may be used to modify channel LLR values (e.g., intrinsic values) which are used by all other components in the following manner: (i) the LLR sign may be kept identical to input LLR sign; (ii) the LLR sign may be flipped on bit location specified in $C_{ML}$, and a sign vector of codeword may be updated (updated sign vector of codeword is denoted by $\underline{S}$); and/or (iii) extrinsic output vector $\underline{E}$ may be calculated or given by $$\underline{E} = e(S_1, S_2) \cdot \underline{S} \quad \text{(Equation 12)}$$

where e(S1,S2) is a scalar corresponding to the reliability associated with the maximal likelihood solution $C_{ML}$. $S_1$ and $S_2$ are from Equations 9 and 11, respectively, and correspond to the candidate codewords which have a best score (from Equation 9) and a second best score (from Equation 11).

In sub-step (d), the extrinsic output vector $\underline{E}$ of the target component may be added to channel input LLRs of corresponding bits, to be used by all other components which are dependent on that codeword in associated location.

In Step 3, as step 2 is applied to each component, the decoder may check termination (success) condition, after every component decoding is done. The decoder may repeat Steps 1-3 until success, or max-iteration count is reached (which means failure). These steps for sequential soft decoding are illustrated in FIG. 5, where the result of each component extrinsic values are fed to all other dependent components. In HFPC, all other components may be dependent and also benefit from the updated extrinsic values.

Figure 8:
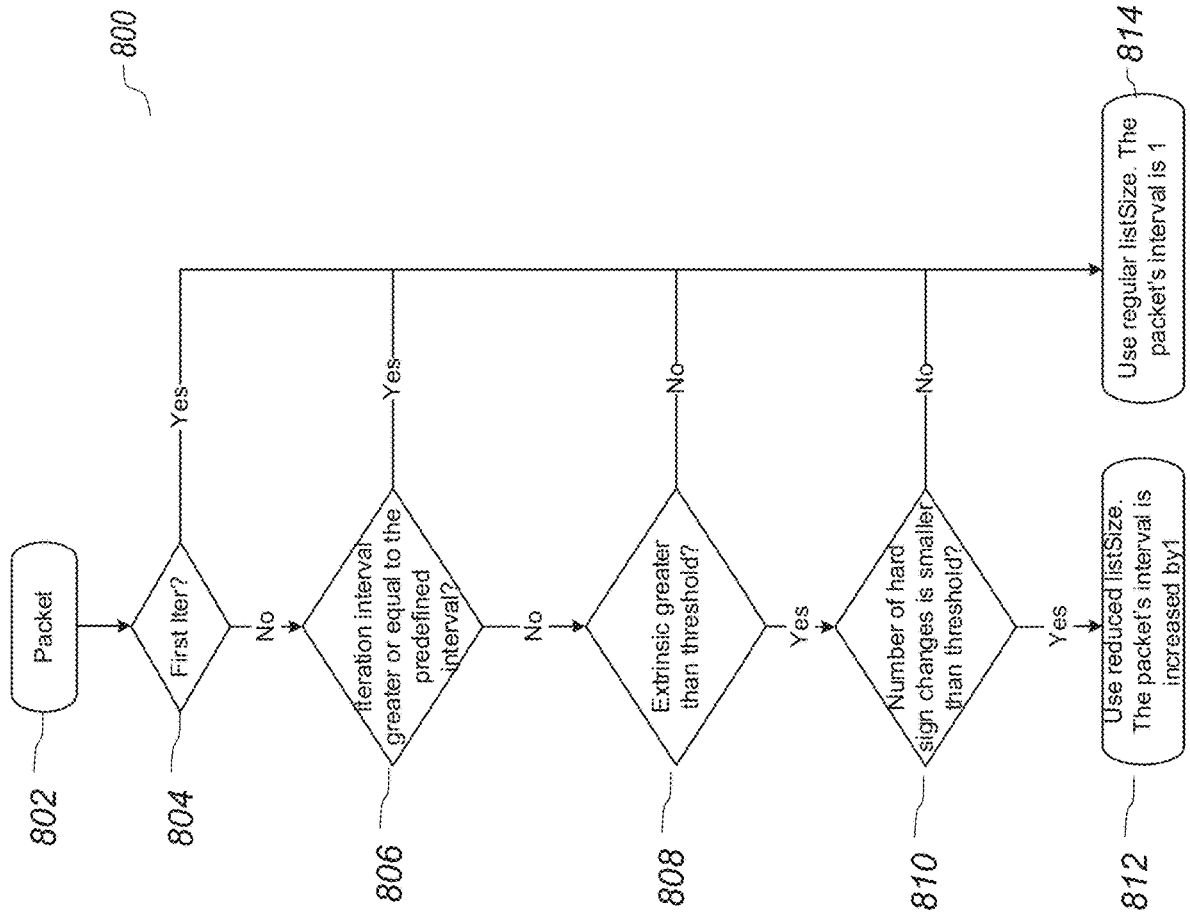
FIG. 8 is a flowchart illustrating an example methodology for dynamically determining a reduced enumeration list size according to some arrangements.

FIG. 8 is a flowchart illustrating another example methodology for iterative soft decoding with joint components processing according to some arrangements.

Figure 6:
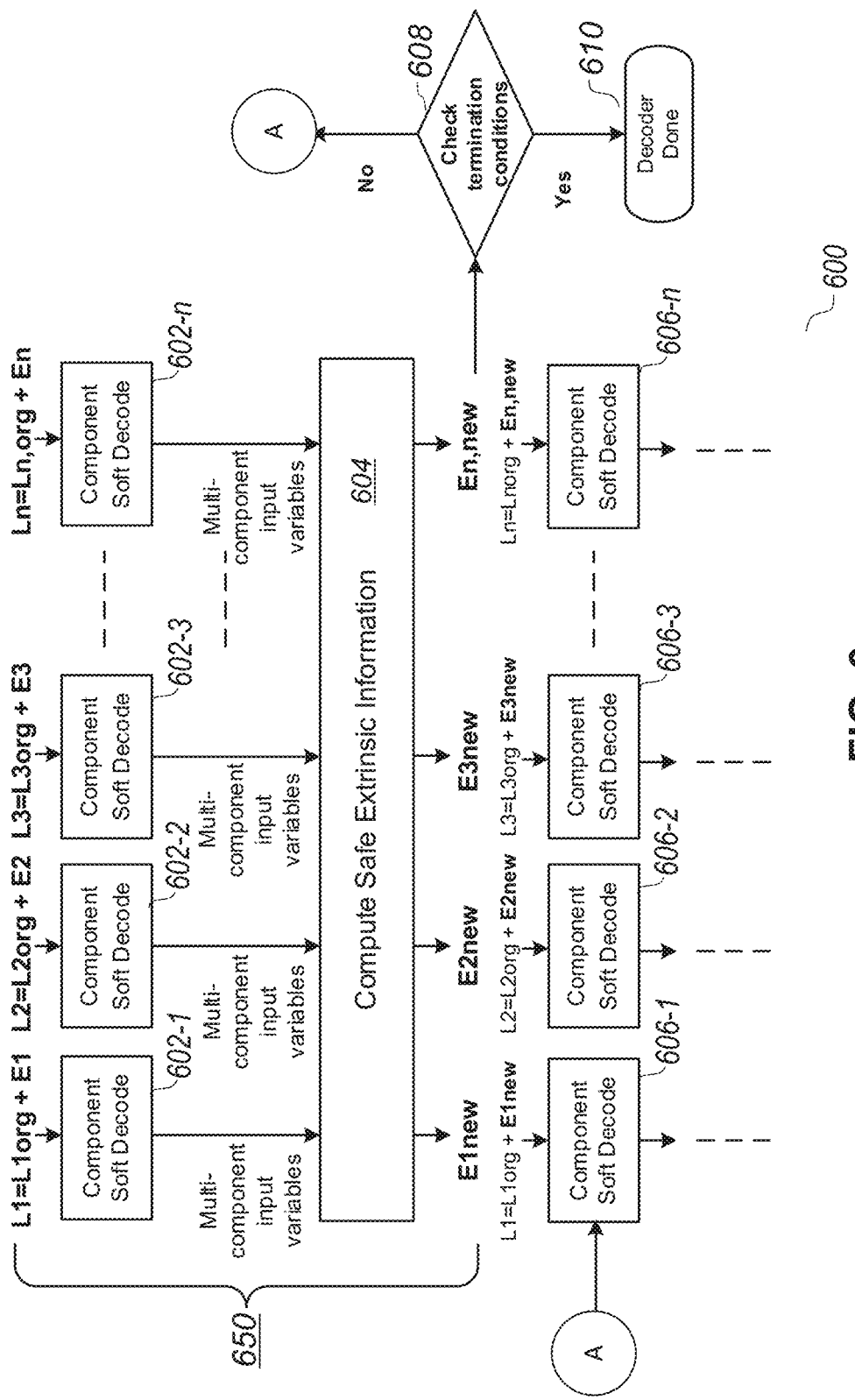
FIG. 6 is a flowchart illustrating an example methodology for iterative soft decoding with joint component processing according to some arrangements.

FIG. 6 shows an example joint components iterative soft decoding flow 600. The flow 600 may perform soft decoding iterations. For example, in a first iteration (S650), the flow may perform soft decoding on each component code of n component codes (S602-1, S602-2, ..., S602-n). Next, the flow may calculate new extrinsic values (e.g., E1new, E2new, ..., En,new) based on results of the component soft decoding steps S602-1, S602-2, ..., S602-n. After calculating the new extrinsic values, the flow may check a termination condition (S608). If the termination condition is met, the flow completes (S610). Otherwise, if the termination condition is not met, the flow may start a second iteration with the new extrinsic values for each component code (S604-1, S604-2, ..., S604-n) until decoding is successful or max-iteration count is reached (which means failure).

Now, a joint components iterative soft decoding of HFPC will be described in more detail. A decoder (e.g., ECC decoder 412 in FIG. 4) may perform joint components iterative soft decoding to obtain high reliability soft decoding. The decoder may perform the following steps (Step 1 to Step 7) to perform the iterative joint decoding for HFPC according to some arrangements. In Step 1, the decoder may create a list of unsolved component codes, e.g. by choosing components with a non-zero syndrome in BCH codes.

In Step 2 (e.g., S602-1, S602-2, ..., S602-n in FIG. 6), for each component for decoding, the decoder may perform the following sub-steps (2a)-(2d). In sub-step (2a), the decoder may perform enumeration of hypothesis and solve every hypothesis, e.g., using a BCH solver. In sub-step (2b), for every valid candidate codeword C, the decoder may compute a score $S_{LLR}(C)$ according to Equation 8. In sub-step (2c), the decoder may calculate and save a best score defined by $$S_1 = \min_{C \in L} S_{LLR}(C)$$

(according to Equation 9) and $$C_{ML} = \operatorname{argmin}_{C \in L} S_{LLR}(C)$$

(according to Equation 10) where L is the valid codeword list. The decoder may also calculate or compute a second best score $$S_2 = \min_{C \in L, C \neq C_{ML}} S_{LLR}(C$$

(according to Equation 11). In sub-step (2d), the decoder may generate a list of bit-locations of best N-solutions, having lowest scores $S_i$, for i=2, ..., N. This list of locations is denoted by $\underline{L}$.

In Step 3, after Step 2 has completed on all components, the decoder may compute, from each component, multi-component input variables, and provide the variables to a generalized extrinsic function (e.g., Step 4 or S604 in FIG. 6). The variables may be computed from (results of) Step 2 for every component. The variables may include the following variables: (1) $\underline{L}$—list of locations as defined in Step 2; (2) $S_1$, $S_2$—two best scores as defined in Step 2; (3) $V_1$—Number of agreed error-locations for fix with other components (from $1^{st}$ solution locations, or associated with $S_1$ of other component codes); (4) $V_2$—Number of components (component codes) that have a zero syndrome and $1^{st}$ solution tries to change; (5) $V_3$—Number of agreed locations for 2nd candidate solution with $1^{st}$ solution of other components; and/or (6) $V_4$—Number of agreed error-locations for fix with other components which have a bit-value LLR input higher than a threshold (from $1^{st}$ solution locations, or associated with $S_1$ of other component codes). In some arrangements, the number of locations in L may be limited to a predetermined number (e.g., 10).

In Step 4 (e.g., S604 in FIG. 6), the decoder may compute an extrinsic value output for the component most likely codeword $C_{ML}$ based on scores $S_1$ and $S_2$. The extrinsic value may be used to modify channel LLR values which are used by all other components in the following manner (sub-step (4a) to sub-step (4d)). In sub-step (4a), the decoder may keep the LLR sign identical to input LLR sign. In sub-step (4b), the decoder may flip sign on bit location specified in $C_{ML}$ and update a sign vector accordingly. The updated sign vector of codeword is denoted by $\underline{S}$. In sub-step (4c), the decoder may generate or calculate an extrinsic output vector by calculating $\underline{E}(S_1, S_2, \underline{L}, V_1, V_2, V_3, V_4) \cdot \underline{S}$. In sub-step (4d), the decoder may perform or execute a generalized extrinsic function using the extrinsic output vector. The extrinsic output vector $\underline{E}(S_1, S_2, \underline{L}, V_1, V_2, V_3, V_4)$ reflects the confidence associated with each output bit. Unlike the scalar value computed for sequential soft decoding, the generalized extrinsic function can allocate lower reliability to bit locations where were included in vector $\underline{L}$ and higher confidence value to other location. The generalized extrinsic function may be also dependent on other components' decoding results so it may allocate higher confidence values when the solution in $C_{ML}$ has many agreements on comparison with other components' results as reflected in $V_1$ or $V_4$.

In Step 5 (e.g., S608 in FIG. 6), as steps 2-4 are applied to all component, the decoder can check termination (success) condition, after every component decoding extrinsic update. In Step 6, the decoder may add the extrinsic output vector of the target component (e.g., E1new, E2new, ..., En, new in FIG. 6) to channel input LLRs of corresponding bits (e.g., L1org, L2org, ..., Ln_org in FIG. 6), to be used by all other components on next decoding iteration. In Step 7, the decoder may repeat Step 1 to Step 6 until soft decoding is successful, or max-iteration count is reached (which means failure).

These steps for joint component soft decoding are illustrated in FIG. 6, where the result of each component extrinsic values are fed to all other dependent components. In HFPC, all other components may be dependent and also benefit from the updated extrinsic values. The main different of joint components iterative soft decoding from sequential iterative soft decoding is that the extrinsic output is computed from each component before each iteration. During the progress of an iteration, the extrinsic values are static, and cannot be updated.

Joint components soft decoding approach has two main benefits: (1) higher reliability compared to sequential soft decoding; and (2) straightforward parallel implementation on hardware, as it performs the update of extrinsic values only after an iteration is done. During the iterations, the LLR inputs may be predetermined (from previous iteration). The parallel implementation may include simultaneous component soft decoding for multiple components during a given iteration.

Figure 9:
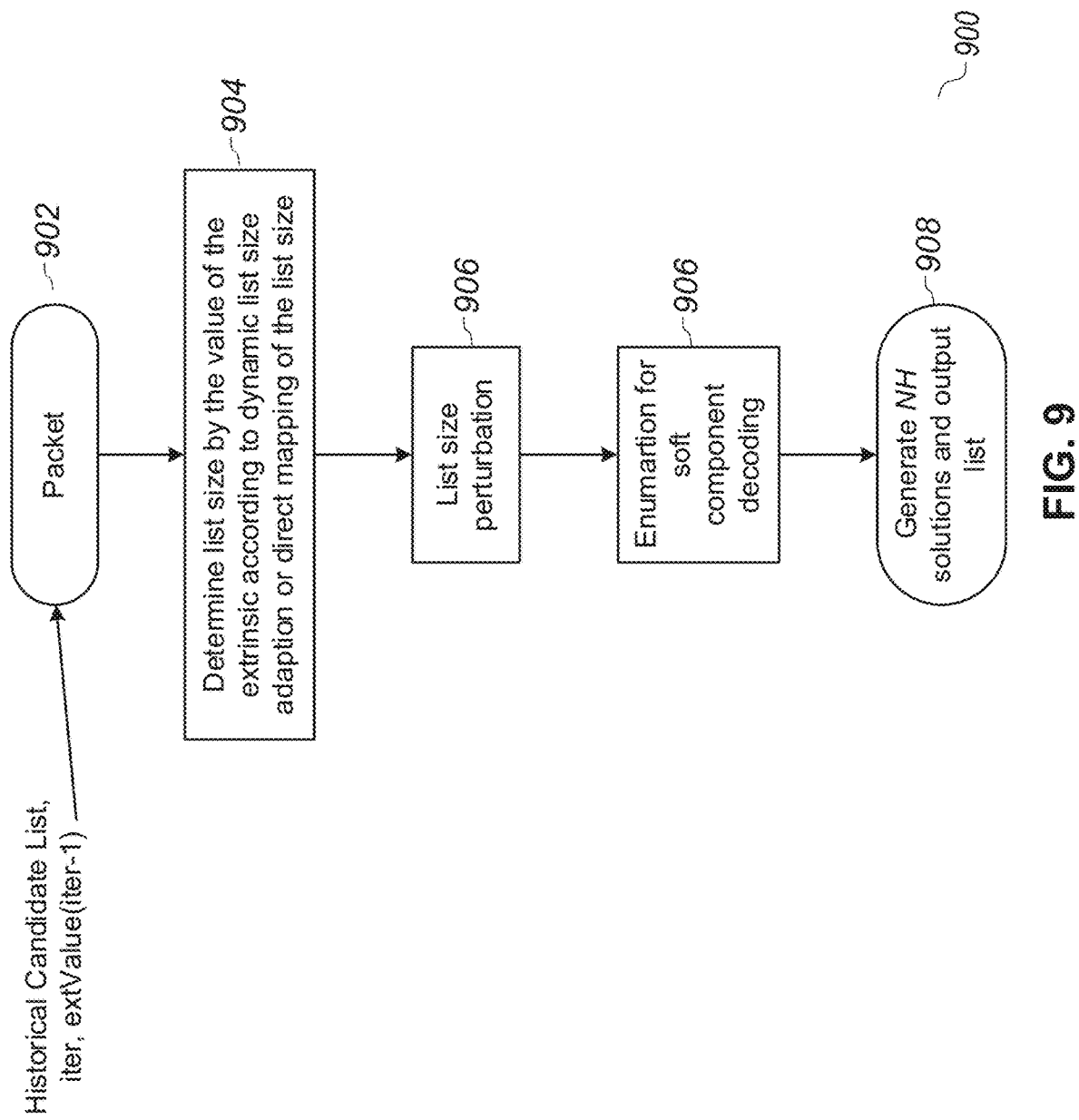
FIG. 9 is a flowchart illustrating an example methodology for adapting an enumeration list size according to some arrangements.

FIG. 9 is a flowchart illustrating an example methodology for iterative soft decoding with generation of historical candidate list according to some arrangements.

Before describing details of candidate list-based iterative soft decoding, some terms will be defined as follows. The term "hypothesis" is defined as a list of bit locations that are flipped manually or automatically, so that after the flips, a decoder (e.g., the BCH decoder) tries to solve the component corresponding to the bit locations specified in the hypothesis. The term "solver's solution" is defined as a solution returned from a solver (e.g., BCH solver) after the hypothesis' bits are flipped. The term "solution" is defined as bits locations of the hypothesis and the matching solver's solution. The term "list size" is defined as the number of hypotheses evaluated. This number might be different for each component code. The term "LLR score" is defined as LLR score $S_i$ (for each solution) such that LLR score $S_i$ is the sum of the absolute LLR values of the solution and hypothesis flips. The term "most likely candidate" is defined as the solution with the lowest LLR score $S_1$. The term "extrinsic value" is defined as an update value for input LLRs that is computed by a decoding process of a single component code. An extrinsic value may reflect the reliability associated with a suggested solution by the most likely candidate of a component code.

FIG. 7 shows an example candidate list-based iterative soft decoding flow 700. The flow 700 may perform (e.g., by a decoder such as ECC decoder 412 in FIG. 4) soft decoding iterations while maintaining a candidate list from a previous iteration. The flow 700 may start with initial LLR values for every codeword bit, and the associated component code bits LLRs L1, L2, . . . , Ln may be passed for performing component decoding. During an iteration, the flow may perform soft decoding on each component code of n component codes (S702-1, S702-2, . . . , S702-n) with LLR inputs (L1, L2, . . . , Ln).

Next, the flow may calculate (S706) new extrinsic values (e.g., E1, E2, . . . , En) based on results of the component soft decoding steps S702-1, S702-2, . . . , S702-n. Each component soft decoding step may perform enumeration on error candidates which are internally generated, and on candidates (in a candidate list H1, H2, . . . , Hn) which are provided from previous iterations (these are not available on first iteration). Using the results of all component decoding steps, a reliability of the most likelihood solution can be computed, from which the extrinsic values per component are computed, these are marked as E1, E2, . . . , En in FIG. 7.

After calculating the new extrinsic values, the flow may update a candidate list (H1, H2, . . . , Hn) corresponding to each component code (S708-1, S708-2, . . . , S708-n). In some arrangements, each of H1, H2, . . . , Hn may be a list of N most likely candidates (N is a predetermined number). For example, step S708-1 of the flow may compute input LLR L1 and update a list of N most likely candidates (H1), step S708-2 of the flow may compute input LLR L2 and update a list of N most likely candidates (H2), and so on. In some arrangements, from all extrinsic values, a set of updated LLR values per code component (L1, L2, . . . , Ln) may be computed, and the list of most likely candidates are updated according to the updated LLRs. This update may include elimination of error locations which were corrected after computation of updated LLRs. The updated candidate list may be prepared and passed for next iteration, which is marked as H1, H2, . . . , Hn—a list for every component code.

The flow may determine an enumeration size or a list size based on the updated candidate list (S710-1, S710-2, . . . , S710-n). For example, step S710-1 may determine a list size for next enumeration (M1), step S710-2 may determine a list size for next enumeration (M2), and so on. In some arrangements, using the computed extrinsic value and its reliability compared to previous iteration, the list size (also called enumeration list size or enumeration size) for next iteration may be determined, which is marked by M1, M2, . . . , Mn for every component. There are several methods to determine the enumeration size, as will be described below with reference with FIG. 8 and FIG. 9.

After determining respective enumeration sizes, the flow may check a decoding termination condition (S712). If the termination condition is met, the flow completes (S716). Otherwise, if the termination condition is not met, the flow may start a second iteration with the updated candidate list for each component code until decoding is successful or a max-iteration count is reached (which means failure). In some arrangements, in step S712, the flow may perform computation of a full codeword hard decision and check if termination condition is met (e.g. CRC signature is 0). If conditions are met, then decoding success is declared, otherwise, the decoder continue to next iteration, until success of maximal iteration count is reached.

In this manner, the flow 700 may dynamically calculate decoding complexity (e.g., enumeration size) per component. Moreover, in a candidate list-based iterative soft decoding, during an iteration, the enumeration over hypotheses may be performed using candidates from the previous iteration, according to certain conditions.

Now, a historical candidate list (also called historical list or candidate list) will be described in more detail. It is noted that in a lot of cases the correct solution of current iteration can be one of the candidates that have been considered on the previous iteration. In some arrangements, a historical list may save or store the NH highest likelihood candidates which had scores $\{S_1, S_2, \ldots, S_{N_H}\}$. These candidates may be saved or stored for the next iteration, and may be passed to the solver as hypotheses (since the component might be changed between the iterations) and after the solver solves those hypotheses in the candidate list, the solver may solve the other normal hypotheses that are generated without historical information (the list size is the number of such hypotheses). For example, if the decoder returns, as the third best solution, the solution [5, 44, 56, 123, 137], this (third best) solution may be passed as the third hypothesis (in a candidate list) to the decoder in the next iteration (before the regular hypotheses are generated) and the solver may attempt to solve the third hypothesis. This may be performed if there is change in the logical values of the components bits. Moreover, if a bit of the component (e.g., the bit in location 44 of the component) has been flipped between the iterations, the location 44 may be removed from the historical list hypothesis, and therefore [5, 56, 123, 137] may be passed as a hypothesis to the next iteration.

Figure 10:
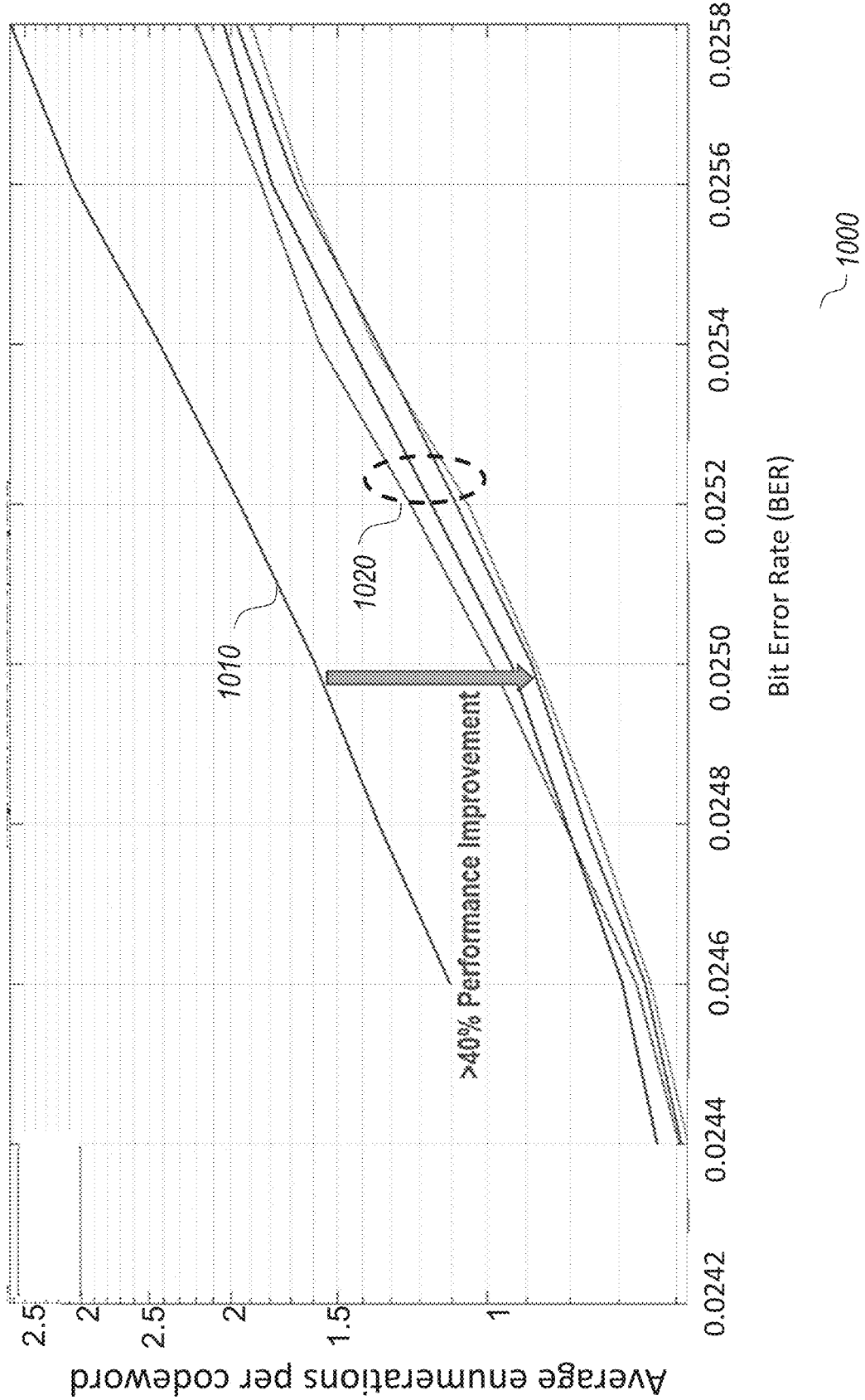
FIG. 10 is a diagram illustrating exemplary performance improvement of HFPC soft decoding with historical list and dynamic list size selection, according to some arrangements.

FIG. 10 is a flowchart illustrating an example methodology for dynamically determining a reduced enumeration list size according to some arrangements.

According to some arrangements, if a true solution is found by using a deep hypothesis (e.g., a hypothesis that appears after evaluating many other hypotheses) and save it in the historical list, the next iteration may benefit from historical list candidates, and does not have to enumerate over too many new hypotheses, provided that a component was not significantly changed from previous iteration. Hence, under some restrictions, the list size can be considerably reduced, thereby allowing significant complexity reduction. For example, the list size may be reduced from 3,000 enumerations to 100 enumerations when a meaningful historical list is saved between iterations. FIG. 8 shows an example dynamic enumeration list size determination flow 800.

Referring to FIG. 8, in some arrangements, the flow 800 may be used to determine an enumeration list size in step 710-1, 7102, . . . , 710-$n$ in FIG. 7. In some arrangements. The flow 800 may start with receiving a component code, and list size parameters and list size configuration parameters associated with the component code, in an iteration (e.g., $i^{th}$ iteration) (S802). In some arrangements, the list size parameters may be used or defined per component code. In some arrangements, the list size parameters may include (1) a current interval which is a number of iterations performed from the last iteration in which a full number of enumerations (FULL_NUM, which is defined below) is used; (2) a previous extrinsic value which has been calculated or obtained in the previous iteration; and/or (3) a number of sign changes on a component input threshold.

In some arrangements, the list size configuration parameters may include (1) a reduced number of enumeration (REDUCED_NUM), (2) a full number of enumeration (FULL_NUM), (3) an iteration interval threshold (INT_THRESHOLD), (4) an extrinsic value threshold (EXT_THRESHOLD), and/or a maximum sign changes threshold (SIGN_THRESHOLD). The list size parameters may be predetermined or dynamically configured per component code. The parameter REDUCED_NUM is a default number of enumerations when using a reduced list size under certain conditions defined below. The parameter FULL_NUM is a number of enumerations in case a full enumeration list size is used. In some arrangements, FULL_NUM may be determined by a configuration. This configuration may depend on the computational complexity limitations, derived from the latency constraints and specific hardware implementation. If there is no stringent latency constraint, the parameter FULL_NUM may be set to a maximal value which sufficiently approximates the maximal likelihood decoder capability for a single component decoder. The parameter INT_THRESHOLD is a maximum number of iterations between two iterations in which FULL_NUM is. For example, if INT_THRESHOLD is 3, a full list size (FULL_NUM) may be used after two iterations in which a reduced list size (REDUCED_NUM) for specific component is used. The extrinsic value threshold (EXT_THRESHOLD) is an extrinsic value threshold for allowing a reduced list size. A full list size is used if the extrinsic value from the last iteration is lower than EXT_THRESHOLD (meaning that current solution has low confidence). This is done in order to prevent repeating on wrong solution too much times. The parameter SIGN_CHANGE_THRESHOLD is a threshold for the number of sign changes on component input threshold. A full list size is used if there are more changed on the hard decision of the component than SIGN_CHANGE_THRESHOLD. This is used to prevent a reduced list size for a component that its hard decision changed in too many locations between the iterations, since in such situation the historical hypotheses in a historical list may turn out to be useless. In methods for adapting a list size (e.g., flow 900 in FIG. 9), all of these parameters (e.g., list size parameters and list size configuration parameters) may not be used, since the list size is determined by adaptive list size features which will be described with reference with FIG. 9.

In some arrangements, referring to FIG. 8, the flow may determine whether the current iteration is the first iteration (i=1) (S804). In response to determining that the current iteration is the first iteration, the flow may proceed to step S814 to set the enumeration list size to FULL_NUM. In response to determining that the current iteration is not the first iteration, the flow may proceed to step S806. In S806, the flow may determine whether the current interval (as received in S802) is greater than or equal to INT_THRESHOLD. In response to determining that the current interval is greater than or equal to INT_THRESHOLD, the flow may proceed to step S814 to set the enumeration list size to FULL_NUM. In response to determining that the current interval is smaller than INT_THRESHOLD, the flow may proceed to step S808.

In S808, the flow may determine whether the previous extrinsic value (as received in S802) is greater than EXT_THRESHOLD. In response to determining that the previous extrinsic value is smaller than or equal to EXT_THRESHOLD, the flow may proceed to step S814 to set the enumeration list size to FULL_NUM. In response to determining that the previous extrinsic value is greater than EXT_THRESHOLD, the flow may determine or set an enumeration list size to be REDUCED_NUM, and increase the current interval by 1 (which means the next iteration will be the (current interval+1)$^{th}$ iteration since FULL_NUM is used). In S814, the flow may determine or set an enumeration list size (also called list size, or number of enumerations) to be FULL_NUM, and set the current interval to 1 (which means the next iteration will be the first iteration since FULL_NUM is used).

Figure 11:
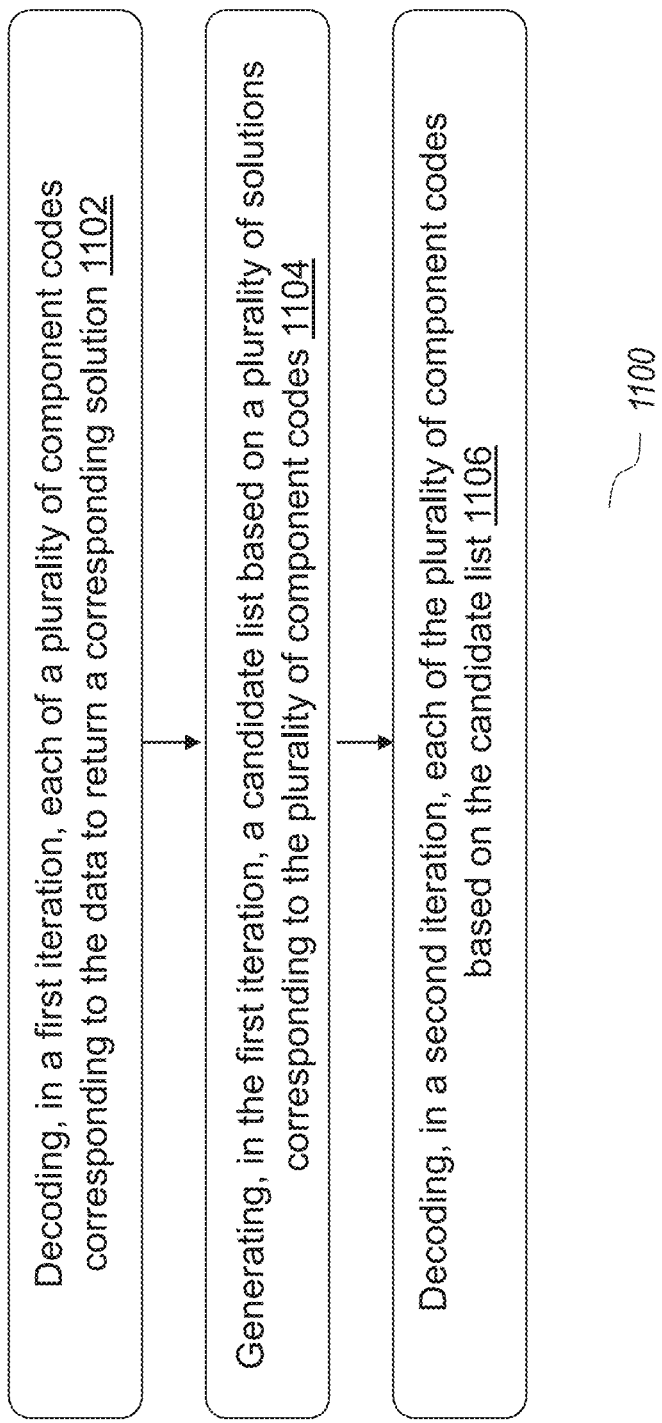
FIG. 11 is a flowchart illustrating an example methodology for iterative decoding using a candidate list according to some arrangements.

FIG. 11 is a flowchart illustrating an example methodology for adapting an enumeration list size according to some arrangements.

FIG. 9 shows an example adaptive enumeration list size determination flow 900. The flow 900 may start with receiving a component code and parameters associated with the component code in an iteration (e.g., $i^{th}$ iteration) (S902). In some arrangements, the parameters may include (1) a historical list, and (2) an extrinsic value (e.g., an extrinsic value calculated or obtained from the current iteration or the previous iteration (e.g., (i−1)$^{th}$ iteration)). For example, a new component soft decoding on the $i^{th}$ iteration may receive a historical candidate list, together with an iteration count (e.g., i) and/or the extrinsic value computed in the previous iteration. All these inputs may be used to determine the list size for enumeration. In some arrangements, the flow 900 may be used to determine an enumeration list size in step 710-1, 710-2, . . . , 710-$n$ in FIG. 7.

In step S904, the flow may determine a list size based on the extrinsic value calculated or obtained in the current (e.g., i$^{th}$) iteration or the previous iteration. In some arrangements, the flow may determine a list size based on the extrinsic value using (1) a dynamic list size adaptation (which will be described below). In some arrangements, the flow may determine a list size based on the extrinsic value using (2) a direct mapping of the list size (which will be described below). Next, in step S906, the flow may perform (3) a list size perturbation (which will be described below) to update the list size. The flow may perform enumerations for component soft decoding and generate a number of solutions and output a historical list (S908). In some arrangements, the historical list size may be used together with the new enumerations performed for soft decoding of the current component. The output of current component may be the NH best score candidates, which have the lowest absolute sum-LLR scores. These candidates may be saved in the historical list and used on the next iteration. In safe soft decoding (e.g., step 604 in FIG. 6), the extrinsic value of current iteration may be computed after all components have been solved.

Now, (1) a dynamic list size adaptation will be described. According to some arrangements, an adaptive list size may be set to determine the list size of each component by states which depend on previous extrinsic value, iteration, etc. Adaptive enumeration size is used to detect components that are nearly solved. That is, the error bits may have the lowest LLR so the true solution should appear early in the enumeration process, and thus short enumerations can be used via configurations of a short list size.

TABLE 1

Extrinsic value thresholds and interval parameters example for adapting the enumeration list size according to embodiments of this invention.

| Threshold for avoid increasing list size (LOW_THRESHOLD) | Threshold for decreasing list size (HIGH_THRESHOLD) | $N_L$ Configurations of enumeration list size (with initial value of 3000) | Change LS interval |
|---|---|---|---|
| 10 | 18 | [500 1000 2000 3000 4000 4500] | 5 |

In some arrangements, the extrinsic value computed for each component may be used every 'interval' of iterations (for example, every $5^{th}$ iteration as in Table 1 above). For example, in the current iteration, for each component code, the list size for enumeration for the next iteration may be determined. In some arrangements, there is a sorted list of $N_L$ predetermined configurations or values of enumeration list sizes (see Table 1). A value may be selected according to the component decoder extrinsic value of the current iteration. For example, if the extrinsic value does not pass a threshold, e.g., smaller than LOW_THRESHOLD (see Table 1), the list size may be increased by choosing the next larger list size in the list of $N_L$ configurations, so taking a larger list size (the list is sorted). If the extrinsic passes the threshold, e.g., greater than or equal to LOW_THRESHOLD, the list size may remain the same. Furthermore, if the extrinsic passes a higher threshold, e.g., greater than or equal to HIGH_THRESHOLD, the list size may be reduced by choosing the next smaller enumeration list out of $N_L$ configurations.

Table 1 above describes an exemplary configuration which can be used as follows. Each component may start with a pre-determined initial value, e.g., ListSize=3000. After an interval of 5 iterations, for each component that does not pass LOW_THRESHOLD (e.g., smaller than 10 according to Table 1) during the last 5 iterations, ListSize may be increased to be 4000. If some component pass HIGH_THRESHOLD (e.g., greater than or equal to 18), the list size may be reduced to 2000. Such update may be repeated every 5 iterations, changing the ListSize value according to the extrinsic value computed per component.

Now, (2) a direct mapping of the list size will be described. According to some embodiments of the invention, the list size can be determined directly from the extrinsic value computed for the component on the previous iteration using a mapping threshold vector. For example, a mapping threshold vector extTH can be defined as [0 7 20 24], and a corresponding list size vector of list Vec can be defined as [4000, 3000, 2000, 500]. The list size for the component on next iteration may be an entry of the list size vector corresponding to an $N^{th}$ entry of the mapping such that such that the last extrinsic value is smaller than or equal to a value of the $(N+1)^{th}$ entry or greater than or equal to a value of $N^{th}$ entry. For example, listSize=4000 (N=1) if the last extrinsic is smaller than 7 (value of $(N+1)^{nd}$ entry), and listSize=500 (N=4) if the last extrinsic value is greater than or equal to 24 (value of $N^{th}$ entry).

Now, (3) a list size perturbation will be described. According to some arrangements, the list size may not remain fixed for too many iterations, and may be increased or decreased by some predefined factor as a function of the iteration count. For example, a vector of factors may be define per iteration e.g. factors Vec=[1 1 1.1 0.9 1.2 0.8, . . . 1], where factors Vec is a list of values for multiplying the list size (in the $N^{th}$ iteration) by the value of the corresponding entry of factors Vec ($N^{th}$ entry). For example, if the list size in the first iteration (N=1) is 3000 before perturbation, the list size in the first iteration after perturbation will be 3000 (=3000*1). If the list size in the third iteration (N=3) is 3000 before perturbation, the list size in the third iteration after perturbation will be 3300 (=3000*1.1).

Figure 12:
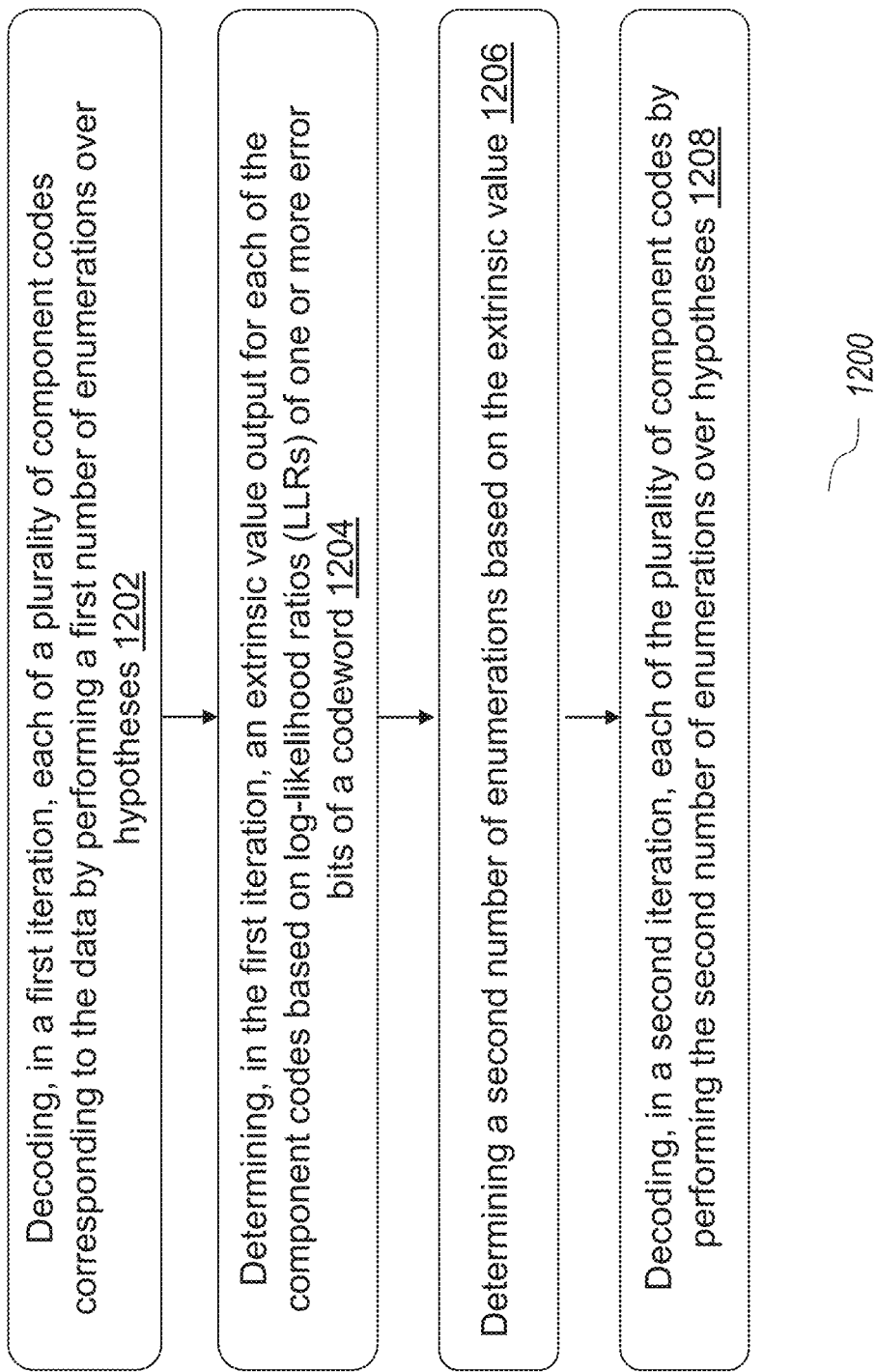
FIG. 12 is a flowchart illustrating an example methodology for dynamically determining an enumeration size according to some arrangements.

FIG. 12 is a diagram illustrating exemplary performance improvement of HFPC soft decoding with historical list and dynamic list size selection, according to some arrangements.

FIG. 10 shows curvers showing simulation results in which X-axis represents bit error rates (BER) while Y-axis represents average enumerations per codeword (including failures). FIG. 10 is based on a simulation which (1) measure the total number of enumerations performed for soft decoding of a single codeword, and (2) average the total number over multiple codewords. The curve 1010 corresponds to a full list enumeration, while each of the other curves 1020 shows the total number of enumerations when using different arrangements of the present disclosure, under several valid configurations. It is noted that the decoding capability is also improved, and the probability of codeword error is reduced when using the methods of dynamically or adaptively determining a reduced enumeration list size according to some arrangements of the present disclosure.

FIG. 11 is a flowchart illustrating an example methodology for iterative decoding using a candidate list according to some arrangements.

In some arrangements, the example methodology relates to a process 1100 for performing operations on a flash memory (e.g., flash memory module 402 in FIG. 4) by a circuit (e.g., ECC decoder 412 in FIG. 4) of a flash memory system (e.g., flash memory system 400 in FIG. 4).

In this example, the process 1100 begins in step S1102 by decoding, in a first iteration, each of a plurality of component codes (e.g., N component codes in FIG. 6 and FIG. 7) corresponding to the data to return a corresponding solution. In some implementations, each of the plurality of component codes is a Bose-Chaudhuri-Hocquenghem (BCH) code.

In step S1104, in some arrangements, the circuit may be configured to generate, in the first iteration, a candidate list (e.g., historical list H1, H2, . . . , Hn in FIG. 7) based on a plurality of solutions corresponding to the plurality of component codes. The candidate list may include one or more solutions having lowest log-likelihood ratios (LLRs) among the plurality of solutions.

In some implementations, each of the one or more solutions may include bit locations. In generating the candidate list, the circuit may be configured to determine whether a bit at a first bit location of a component code is flipped at the first iteration. In response to determining that the first bit location is flipped at the first iteration, the circuit may be configured to remove the first bit location from a solution of the candidate list.

In some implementations, in generating the candidate list in the first iteration, the circuit may be configured to obtain a previous candidate list passed from an iteration that is prior to the first iteration, and update the previous candidate list based on the plurality of solutions. In updating the previous candidate list, the circuit may be configured to calculate extrinsic values for component codes based on the plurality of solutions, calculate LLR values for the component codes based on the extrinsic values, and update the previous candidate list based on the LLR values for the component codes.

In step S1106, in some arrangements, the circuit may be configured to decode, in a second iteration, each of the plurality of component codes based on the candidate list. For example, a solver may solve those hypotheses in the candidate list, and then may solve the other normal hypotheses that are generated without historical information.

In some implementations, in decoding, in the second iteration, each of the plurality of component codes based on the candidate list, the circuit may be configured to solve hypotheses based on the one or more solutions of the candidate list. After solving hypotheses based on the one or more solutions of the candidate list, the circuit may be configured to generate a plurality of hypotheses without using the candidate list, and solve the generated plurality of hypotheses.

FIG. 12 is a flowchart illustrating an example methodology for dynamically determining an enumeration size according to some arrangements.

In some arrangements, the example methodology relates to a process 1200 for performing operations on a flash memory (e.g., flash memory module 402 in FIG. 4) by a circuit (e.g., ECC decoder 412 in FIG. 4) of a flash memory system (e.g., flash memory system 400 in FIG. 4).

In this example, the process 1200 begins in step S1202 by decoding, in a first iteration, each of a plurality of component codes corresponding to the data by performing a first number of enumerations over hypotheses. In some implementations, each of the plurality of component codes may be a Bose-Chaudhuri-Hocquenghem (BCH) code.

In step S1204, in some arrangements, the circuit may be configured to determine, in the first iteration, an extrinsic value output for each of the component codes based on log-likelihood ratios (LLRs) of one or more error bits of a codeword (e.g., determining or generating extrinsic values in step 604 in FIG. 6 or step 706 in FIG. 7).

In step S1206, in some arrangements, the circuit may be configured to determine a second number of enumerations based on the extrinsic value. In some implementations, in determining the second number of enumerations, the circuit may be further configured to determine whether the extrinsic value is greater than or equal to a threshold value (e.g., an extrinsic value threshold (EXT_THRESHOLD)). In response to determining that the extrinsic value is greater than or equal to the threshold value, the processing circuits may be configured to determine the second number of enumerations that is smaller than the first number (e.g., a reduced number of enumeration (REDUCED_NUM)). In response to determining that the extrinsic value is smaller than the threshold value, the processing circuits may be configured to determine the second number of enumerations (e.g., that is greater than or equal to the first number (e.g., a full number of enumeration (FULL_NUM)).

In some implementations, the circuit may be further configured to obtain an enumeration list of enumeration numbers such that enumeration numbers are saved in the list in an increasing order (e.g., [500 1000 2000 3000 4000 4500]). The first number of enumerations may correspond to an enumeration number at a first location of the enumeration list (e.g., the number in the $1^{st}$ iteration may correspond to the $3^{rd}$ entry of the enumeration list (=3000)). In determining the second number of enumerations, the circuit may be further configured to determine whether the extrinsic value is smaller than an increasing threshold value (e.g., LOW_THRESHOLD=10). In response to determining that the extrinsic value is smaller than the increasing threshold value (e.g., the extrinsic value is smaller than 10, and the current number of enumeration corresponds to 3rd entry of the enumeration list), the circuit may be configured to determine the second number to be an enumeration number at a location of the enumeration list next to the first location (e.g., $4^{th}$ entry of the enumeration list (=4000)). The circuit may be further configured to determine whether the extrinsic value is greater than or equal to a decreasing threshold value that is greater than the increasing threshold value (e.g., HIGH_THRESHOLD=18). In response to determining that the extrinsic value is greater than or equal to the decreasing threshold value (e.g., the extrinsic value is greater than 18, and the current number of enumeration corresponds to 3rd entry of the enumeration list), the circuit may be configured to determine the second number to be an enumeration number at a location of the enumeration list prior to the first location (e.g., 2nd entry of the enumeration list (=2000)).

In some implementations, the circuit may be further configured to obtain a threshold list of threshold values (e.g., [0 7 20 24]) such that threshold values are saved in the threshold list in an increasing order, and obtain an enumeration list of enumeration numbers (e.g., [4000, 3000, 2000, 500]) such that enumeration numbers are saved in the enumeration list in an increasing order corresponding to the threshold values in the threshold list.

In determining the second number of enumerations, the circuit may be further configured to determine whether the extrinsic value is greater than or equal to a first threshold value at a first location of the threshold list and smaller than a second threshold value at a second location of the threshold list next to the first location. In response to determining that the extrinsic value (e.g., 4) is greater than or equal to the first threshold value (e.g., 0 at $1^{st}$ location of the threshold list) and smaller than the second threshold value (e.g., 7 at 2nd location of the threshold list), the circuit may be configured to determine the second number to be an enumeration number at a location of the enumeration list corresponding the first location of the threshold list (e.g., 4000 at $1^{st}$ location of the enumeration list).

In some implementations, the circuit may be further configured to obtain a number of sign changes in results of hard decision on a particular component code. In determining the second number of enumerations, the circuit may be further configured to determine whether the number of sign changes is greater than or equal to a third threshold value. In response to determining that the number of sign changes is greater than or equal to the third threshold value, the circuit may be configured to determine the second number of enumerations that is greater than or equal to the first number. In response to determining that the number of sign changes is smaller than the third threshold value, the circuit may be configured to determine the second number of enumerations that is smaller than the first number.

In some implementations, the circuit may be further configured to obtain a perturbation list of factor values (e.g., [1 1 1.1 0.9 1.2 0.8, . . . 1]) such that factor values are saved in the perturbation list in an order corresponding to an order of iterations. In determining the second number of enumerations, the circuit may be further configured to determine a third number of enumerations based on results of the first iteration of decoding. The circuit may be configured to determine the second number of enumerations by multiplying the third number by a factor value of the perturbation list corresponding to the second iteration. For example, if the list size in the first iteration (N=1) is 3000 before perturbation, the list size in the first iteration after perturbation will be 3000 (=3000*1). If the list size in the third iteration (N=3) is 3000 before perturbation, the list size in the third iteration after perturbation will be 3300 (=3000*1.1).

In step S1208, in some arrangements, the circuit may be configured to decode, in a second iteration, each of the plurality of component codes by performing the second number of enumerations over hypotheses.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method for decoding data stored in a non-volatile storage device, comprising:
    decoding, in a first iteration, each of a plurality of component codes corresponding to the data to return a respective plurality of solutions, wherein the data has been encoded into the one or more component codes during a process of the data being programmed in the non-volatile storage device, and wherein every information bit in the data is encoded by at least two component codes, and each component code is intersected with all other component codes,
    wherein decoding in the first iteration includes generating a candidate list for each component code based on the plurality of solutions respectively corresponding to each component code of the plurality of component codes into which the data has been encoded;
    updating, for each component code of the plurality of component codes, the candidate list after the decoding is performed in the first iteration; and
    decoding, in a second iteration, each component code of the plurality of component codes into which the data has been encoded based on the updated candidate list for the each component code from the first iteration,
    wherein the candidate list includes one or more ranked solutions having lowest log-likelihood ratios (LLRs) among the plurality of solutions, and
    wherein the decoding in the first and second iterations is performed in connection with a process of reading the data from the non-volatile storage device.

2. The method of claim 1, wherein
    each of the one or more solutions comprises bit locations, and
    generating the candidate list comprises
        determining whether a bit at a first bit location of a component code is flipped at the first iteration, and
        in response to determining that the first bit location is flipped at the first iteration, removing the first bit location from a solution of the candidate list.

3. The method of claim 1, wherein decoding, in the second iteration, each component code based on the candidate list comprises:
    solving hypotheses based on the one or more solutions of the candidate list; and
    after solving hypotheses based on the one or more solutions of the candidate list, generating a plurality of hypotheses without using the candidate list; and
    solving the generated plurality of hypotheses.

4. The method of claim 1, wherein generating the candidate list in the first iteration comprises:
    determining whether there is a previous candidate list passed from a prior iteration that is prior to the first iteration;
    in response to determining that there is a previous candidate list passed from the prior iteration, updating the previous candidate list based on the plurality of solutions; and
    in response to determining that there is no previous candidate list, generating the one or more ranked solutions having lowest LLRs among the plurality of solutions and saving the one or more ranked solutions as the candidate list for the second iteration.

5. The method of claim 4, wherein updating the previous candidate list comprises:
    calculating extrinsic values for component codes based on the plurality of solutions;
    calculating LLR values for the component codes based on the extrinsic values; and
    updating the previous candidate list based on the LLR values for the component codes.

6. The method of claim 1, wherein the decoding each component code in the first iteration comprises:
    obtaining soft input by performing multiple reads from the non-volatile storage device; and
    performing decoding on the soft input.

7. The method of claim 1, wherein decoding is successful after the second iteration if a termination condition is reached.

8. The method of claim 1, wherein the termination condition comprises a CRC signature equaling zero.

9. The method of claim 1, wherein decoding is declared a failure after the second iteration if a maximum number of iterations is reached.

10. A method for decoding data stored in a non-volatile storage device, comprising:
    decoding, in a first iteration, each of a plurality of component codes corresponding to the data to return a plurality of solutions, wherein the data has been encoded into the one or more component codes during a process of the data being programmed in the non-volatile storage device, and wherein every information bit in the data is encoded by at least two component codes, and each component code is intersected with all other component codes;
    generating, in the first iteration, a candidate list based on the plurality of solutions corresponding to each component code of the plurality of component codes into which the data has been encoded; and
    decoding, in a second iteration, each component code of the plurality of component codes into which the data has been encoded based on the candidate list,
    wherein the candidate list includes one or more ranked solutions having lowest log-likelihood ratios (LLRs) among the plurality of solutions, and
    wherein the decoding in the first and second iterations is performed in connection with a process of reading the data from the non-volatile storage device, and
    wherein each of the one or more solutions comprises bit locations, and wherein generating the candidate list comprises
determining whether a bit at a first bit location of a component code is flipped at the first iteration, and
in response to determining that the first bit location is flipped at the first iteration, removing the first bit location from a solution of the candidate list.

* * * * *